(12) United States Patent
Karakawa

(10) Patent No.: US 10,604,845 B2
(45) Date of Patent: Mar. 31, 2020

(54) SUBSTRATE PROCESSING APPARATUS AND SUBSTRATE PROCESSING METHOD

(71) Applicant: TOKYO ELECTRON LIMITED, Tokyo (JP)

(72) Inventor: Takayuki Karakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 97 days.

(21) Appl. No.: 15/724,305

(22) Filed: Oct. 4, 2017

(65) Prior Publication Data

US 2018/0037995 A1 Feb. 8, 2018

Related U.S. Application Data

(62) Division of application No. 14/676,890, filed on Apr. 2, 2015, now abandoned.

(30) Foreign Application Priority Data

Apr. 9, 2014 (JP) .................................. 2014-080532

(51) Int. Cl.
| | |
|---|---|
| *C23C 16/511* | (2006.01) |
| *C23C 16/455* | (2006.01) |
| *C23C 16/44* | (2006.01) |
| *C23C 16/458* | (2006.01) |
| *H01J 37/32* | (2006.01) |

(52) U.S. Cl.
CPC ........ *C23C 16/511* (2013.01); *C23C 16/4404* (2013.01); *C23C 16/4584* (2013.01); *C23C 16/45536* (2013.01); *C23C 16/45551* (2013.01); *H01J 37/32449* (2013.01); *H01J 37/32779* (2013.01)

(58) Field of Classification Search
None
See application file for complete search history.

(56) References Cited

U.S. PATENT DOCUMENTS

| 6,818,517 B1 * | 11/2004 | Maes .................... C23C 16/345 |
|---|---|---|
| | | 257/E21.279 |
| 2006/0228891 A1 | 10/2006 | Blalock et al. |
| 2008/0075858 A1 | 3/2008 | Koh |

FOREIGN PATENT DOCUMENTS

| JP | 2006278497 A | 10/2006 |
|---|---|---|
| TW | 201350619 A | 12/2013 |
| WO | 2013137115 A1 | 9/2013 |

* cited by examiner

*Primary Examiner* — Joel G Horning
(74) *Attorney, Agent, or Firm* — Nath, Goldberg & Meyer; Jerald L. Meyer

(57) ABSTRACT

A substrate processing apparatus includes: a mounting stand provided with a substrate mounting region in which a workpiece substrate is mounted; a process vessel for defining a process chamber including a first region and a second region through which the substrate mounting region passes in order; a precursor gas supply unit for supplying a precursor gas to the first region; a process gas supply unit for supplying a first gas or a second gas differing from the first gas to the second region; at least one plasma generating unit for generating plasma of the first gas or the second gas in the second region; and a control unit for executing a repetition control of repeating a first operation for supplying the first gas to the second region for a first time and a second operation for supplying the second gas to the second region for a second time.

8 Claims, 17 Drawing Sheets

SUBSTRATE PROCESSING APPARATUS AND SUBSTRATE PROCESSING METHOD

CROSS-REFERENCE TO RELATED APPLICATION

This is a Divisional Application of U.S. patent application Ser. No. 14/676,890, filed Apr. 2, 2015, an application claiming the benefit of Japanese Application No. 2014080532, filed on Apr. 9, 2014, in the Japan Patent Office, the disclosures of each of which are incorporated herein in their entirety by reference.

TECHNICAL FIELD

Various aspects and embodiments of the present disclosure relate to a substrate processing apparatus and a substrate processing method.

BACKGROUND

As one example of a method for forming a film on a substrate, a plasma enhanced atomic layer deposition (PE-ALD) method has been used. In the PE-ALD method, a substrate is exposed to a precursor gas, whereby the precursor gas which contains a constituent element of a thin film to be formed is chemisorbed onto the substrate. Subsequently, the substrate is exposed to a purge gas, thereby removing the precursor gas excessively chemisorbed onto the substrate. Then, the substrate is exposed to plasma of a reaction gas which contains a constituent element of a film to be formed, consequently forming a desired thin film on the substrate. In the PE-ALD method, this process is repeated such that a film obtained by processing atoms or molecules contained in the precursor gas is formed on the substrate.

As an apparatus for implementing the PE-ALD method, a semi-batch type film forming apparatus has been used. In the semi-batch type film forming apparatus, a region to which the precursor gas is supplied and a region in which the plasma of the reaction gas is generated, are independently provided within a process chamber. The substrate passes through these regions in the order named. As a result, a desired film is formed on the substrate.

In the aforementioned PE-ALD method, film quality is improved if a modifying process performed using plasma of a modifying gas such as hydrogen or the like is added after the adsorption process performed using the precursor gas or after the reaction process performed using the plasma of the reaction gas.

In the semi-batch type film forming apparatus, when performing the modifying process after the adsorption process or the reaction process, it is thinkable that, in addition to an adsorption process region and a reaction process region, a modifying process region is formed within the process chamber. However, in this case, it is necessary to independently control the gases in a region where the plasma of the reaction gas is generated and in a region where the plasma of the modifying gas is generated. This poses a drawback in that the cost of the substrate processing apparatus becomes higher. Furthermore, the gases are mixed in a region between the region where the plasma of the reaction gas is generated and the region where the plasma of the modifying gas is generated. This leads to deterioration of the processing uniformity and the film quality.

SUMMARY

According to one embodiment of the present disclosure, provided is a substrate processing apparatus including: a mounting stand provided with a substrate mounting region in which a workpiece substrate is mounted, the mounting stand being installed so as to rotate about an axis such that the substrate mounting region is moved in a circumferential direction; a process vessel configured to define a process chamber which accommodates the mounting stand therein, the process chamber including a first region and a second region through which the substrate mounting region moving about the axis in the circumferential direction upon rotation of the mounting stand passes in order; a precursor gas supply unit configured to supply a precursor gas to the first region; a process gas supply unit configured to supply a first gas or a second gas differing from the first gas to the second region; at least one plasma generating unit configured to generate plasma of the first gas or the second gas in the second region; and a control unit configured to execute a repetition control of repeating a first operation for supplying the first gas to the second region for a first time and a second operation for supplying the second gas to the second region for a second time.

According to another embodiment of the present disclosure, provided is a substrate processing method implemented in a substrate processing apparatus which includes a mounting stand provided with a substrate mounting region in which a workpiece substrate is mounted, the mounting stand being installed so as to rotate about an axis such that the substrate mounting region is moved in a circumferential direction, and a process vessel configured to define a process chamber which accommodates the mounting stand therein, the process chamber including a first region and a second region through which the substrate mounting region moving about the axis in the circumferential direction upon rotation of the mounting stand passes in order. The method includes: an adsorption process in which an adsorption layer is formed on a surface of the workpiece substrate by supplying a precursor gas to the first region; a reaction process in which the surface of the workpiece substrate is subjected to reaction by supplying a first gas to the second region and generating plasma of the first gas; and a modifying process in which the surface of the workpiece substrate is modified by supplying a second gas differing from the first gas to the second region and generating plasma of the second gas, wherein a first operation for performing the reaction process for a first time and a second operation for performing the modifying process for a second time are repeated while rotating the mounting stand.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
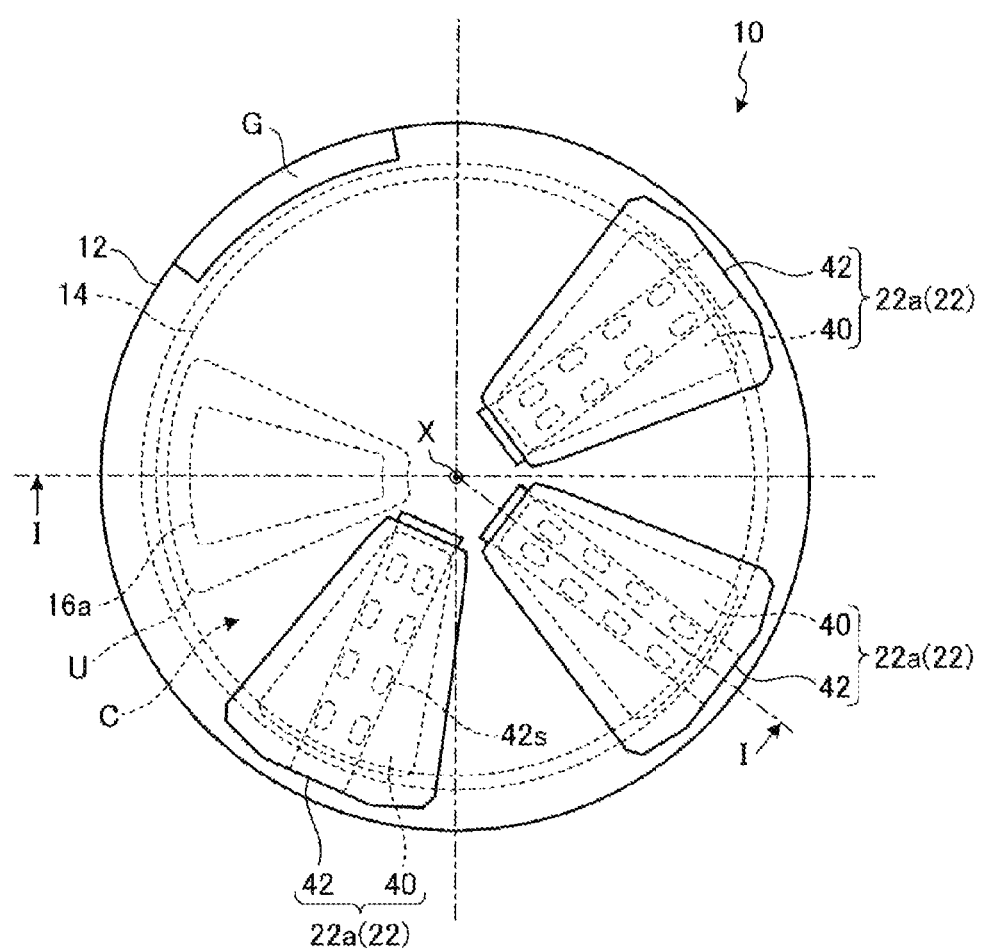
FIG. 1 is a top view schematically showing a substrate processing apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In one embodiment, a substrate processing apparatus according to the present disclosure includes: a mounting stand provided with a substrate mounting region in which a workpiece substrate is mounted, the mounting stand being installed so as to rotate about an axis such that the substrate mounting region is moved in a circumferential direction; a process vessel configured to define a process chamber which accommodates the mounting stand therein, the process chamber including a first region and a second region through which the substrate mounting region moving about the axis in the circumferential direction upon rotation of the mounting stand passes in order; a precursor gas supply unit configured to supply a precursor gas to the first region; a process gas supply unit configured to supply a first gas or a second gas differing from the first gas to the second region; at least one plasma generating unit configured to generate plasma of the first gas or the second gas in the second region; and a control unit configured to execute a repetition control of repeating a first operation for supplying the first gas to the second region for a first time and a second operation for supplying the second gas to the second region for a second time.

In one embodiment of the substrate processing apparatus according to the present disclosure, the at least one plasma generating unit may be at least two plasma generating units, and each of the at least two plasma generating units may include the process gas supply unit and each process gas supply unit may be connected to a common process gas supply source.

In one embodiment of the substrate processing apparatus according to the present disclosure, the total sum of the first time and the second time may differ in length from the time required for the mounting stand to make one revolution about the axis.

In one embodiment of the substrate processing apparatus according to the present disclosure, the control unit may control a length of the first time, a length of the second time, a rotation speed of the mounting stand and a length of a process time such that, when starting and ending the repetition control, the workpiece substrate is located at the same position within the process vessel.

In one embodiment of the substrate processing apparatus according to the present disclosure, the control unit may set the process time to become equal to a time length which is a common multiple of a length of the time required for the mounting stand to make one revolution about the axis and a length of the total sum of the first time and the second time.

In one embodiment of the substrate processing apparatus according to the present disclosure, if the mounting stand makes one revolution about the axis for x seconds, the process gas supply unit repeats the first operation and the second operation based on the first time and the second time which satisfy the following relational expression (1):

$$xk \pm 1 = m + n \quad (1)$$

where m is the first time (seconds, a natural number), n is the second time (seconds, a natural number), and k is an arbitrary natural number.

In one embodiment of the substrate processing apparatus according to the present disclosure, the plasma generating unit may include an antenna configured to irradiate microwaves toward the second region and a coaxial waveguide configured to supply the microwaves to the antenna, line segments defining a cross-sectional outline of the antenna seen in a direction of the axis may include two line segments which go away from each other as the distance from the axis increases, and the coaxial waveguide may be configured to supply the microwaves to the antenna from a gravity center of the antenna.

In one embodiment of the substrate processing apparatus according to the present disclosure, the cross-sectional outline of the antenna seen in the direction of the axis may be a shape having rotational symmetry.

In one embodiment of the substrate processing apparatus according to the present disclosure, the cross-sectional outline of the antenna seen in the direction of the axis may be a substantially equilateral triangular shape.

In one embodiment of the substrate processing apparatus according to the present disclosure, the precursor gas may contain at least silane, the first gas may contain at least nitrogen, and the second gas may contain at least hydrogen.

A substrate processing method according to the present disclosure is implemented in a substrate processing apparatus which includes a mounting stand provided with a substrate mounting region in which a workpiece substrate is mounted, the mounting stand being installed so as to rotate about an axis such that the substrate mounting region is moved in a circumferential direction, and a process vessel configured to define a process chamber which accommodates the mounting stand therein, the process chamber including a first region and a second region through which the substrate mounting region moving about the axis in the circumferential direction upon rotation of the mounting stand passes in order, the method including: an adsorption process in which an adsorption layer is formed on a surface of the workpiece substrate by supplying a precursor gas to the first region; a reaction process in which the surface of the workpiece substrate is subjected to reaction by supplying a first gas to the second region and generating plasma of the first gas; and a modifying process in which the surface of the workpiece substrate is modified by supplying a second gas differing from the first gas to the second region and generating plasma of the second gas, wherein a first operation for performing the reaction process for a first time and a second operation for performing the modifying process for a second time are repeated while rotating the mounting stand.

In one embodiment of the substrate processing method according to the present disclosure, the substrate processing apparatus may include a plurality of plasma generating units disposed in the second region, the plasma generating units configured to generate plasma by using the first gas or the second gas in common.

In one embodiment of the substrate processing method according to the present disclosure, the total sum of the first time and the second time may differ in length from the time required for the mounting stand to make one revolution about the axis.

In one embodiment of the substrate processing method according to the present disclosure, a length of the first time, a length of the second time, a rotation speed of the mounting stand and a length of a process time may be controlled such that, when starting and ending repetition control, the workpiece substrate is located at the same position within the process vessel.

In one embodiment of the substrate processing method according to the present disclosure, the process time may be set to become equal to a time length which is a common multiple of a length of the time required for the mounting stand to make one revolution about the axis and a length of the total sum of the first time and the second time.

In one embodiment of the substrate processing method according to the present disclosure, if the mounting stand makes one revolution about the axis for x seconds, the first operation and the second operation may be repeated based on the first time and the second time which satisfy the following relational expression (1):

$$xk\pm 1 = m+n \qquad (1),$$

where m is the first time (m is a natural number), n is the second time (n is a natural number), and k is an arbitrary natural number.

In one embodiment of the substrate processing method according to the present disclosure, the precursor gas may contain at least silane, the first gas may contain at least nitrogen, and the second gas may contain at least hydrogen.

Some embodiments of the substrate processing apparatus and the substrate processing method according to the present disclosure will now be described in detail with reference to the drawings. The present disclosure is not limited to these embodiments. The respective embodiments may be suitably combined unless a conflict arises in the processing contents.

First Embodiment

Figure 2:
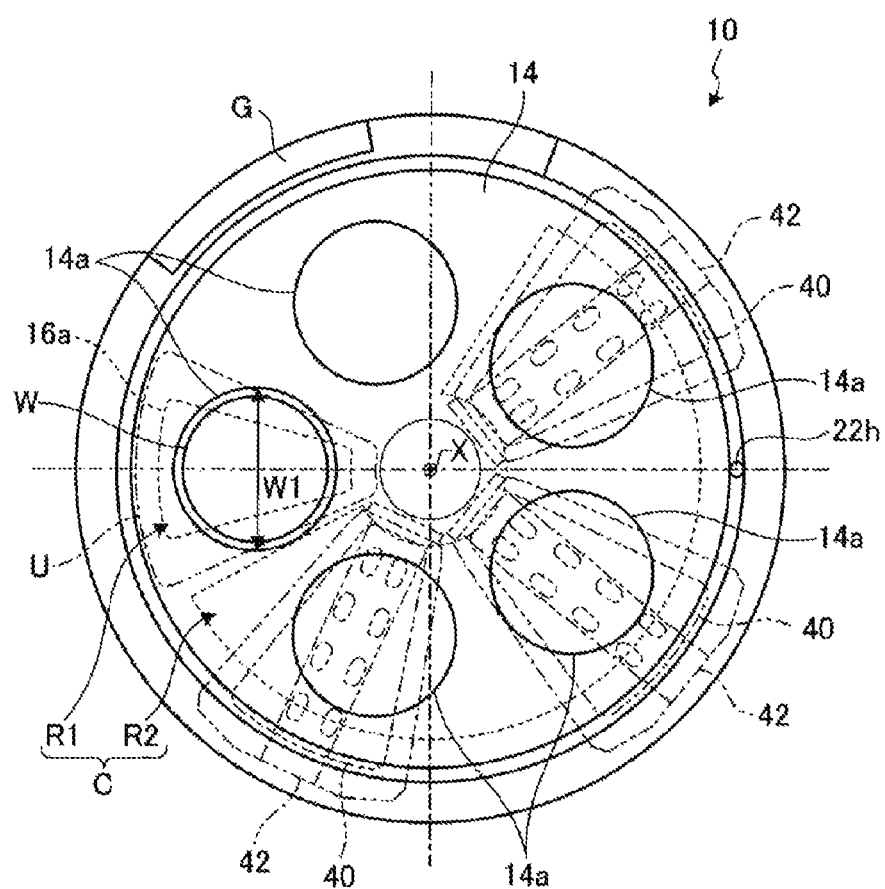
FIG. 2 is a plane view showing a state in which a top portion of a process vessel is removed from the substrate processing apparatus shown in FIG. 1.
Figure 3:
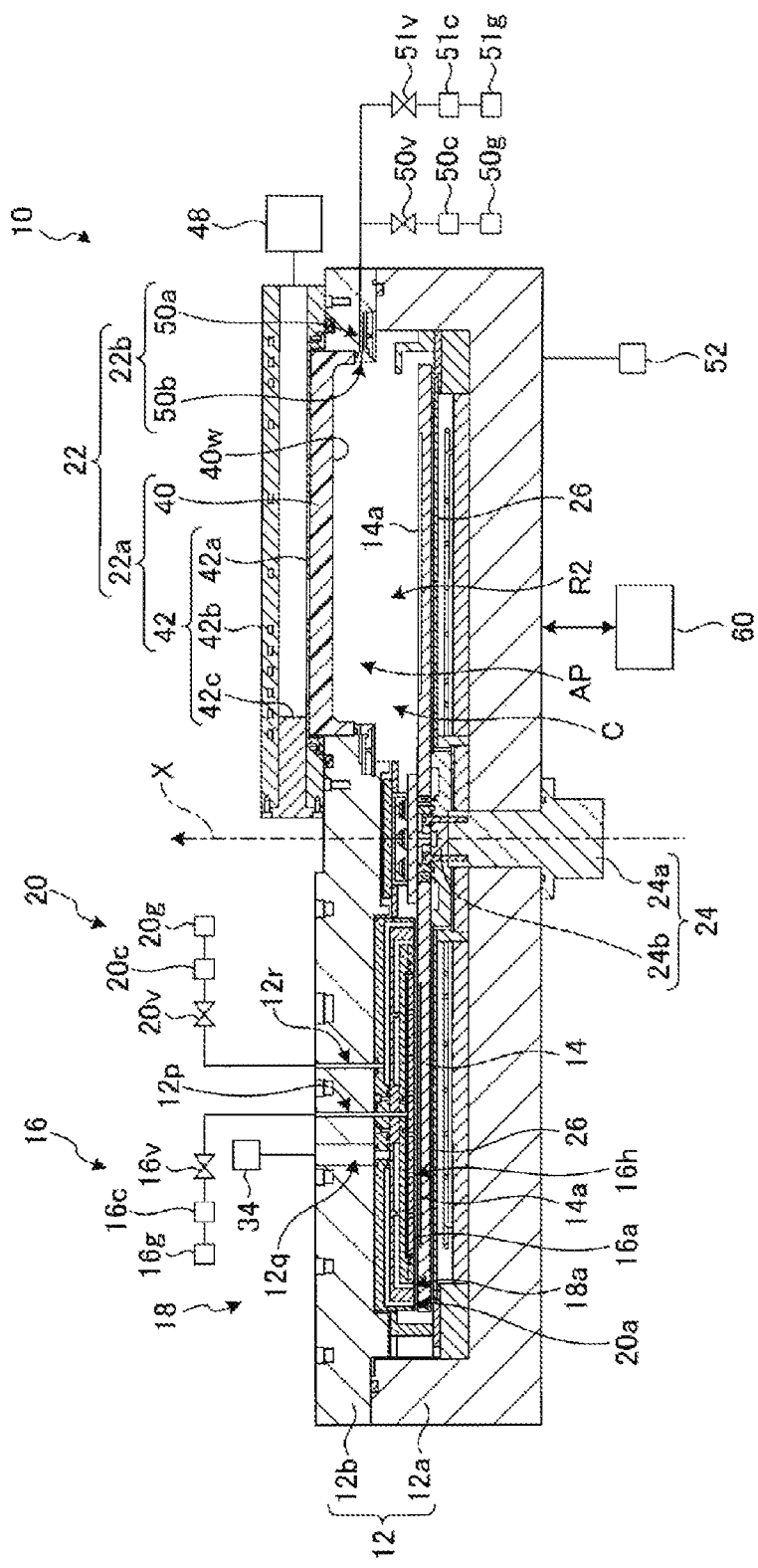
FIG. 3 is a sectional view taken along line I-I in the substrate processing apparatus shown in FIG. 1.
Figure 4:
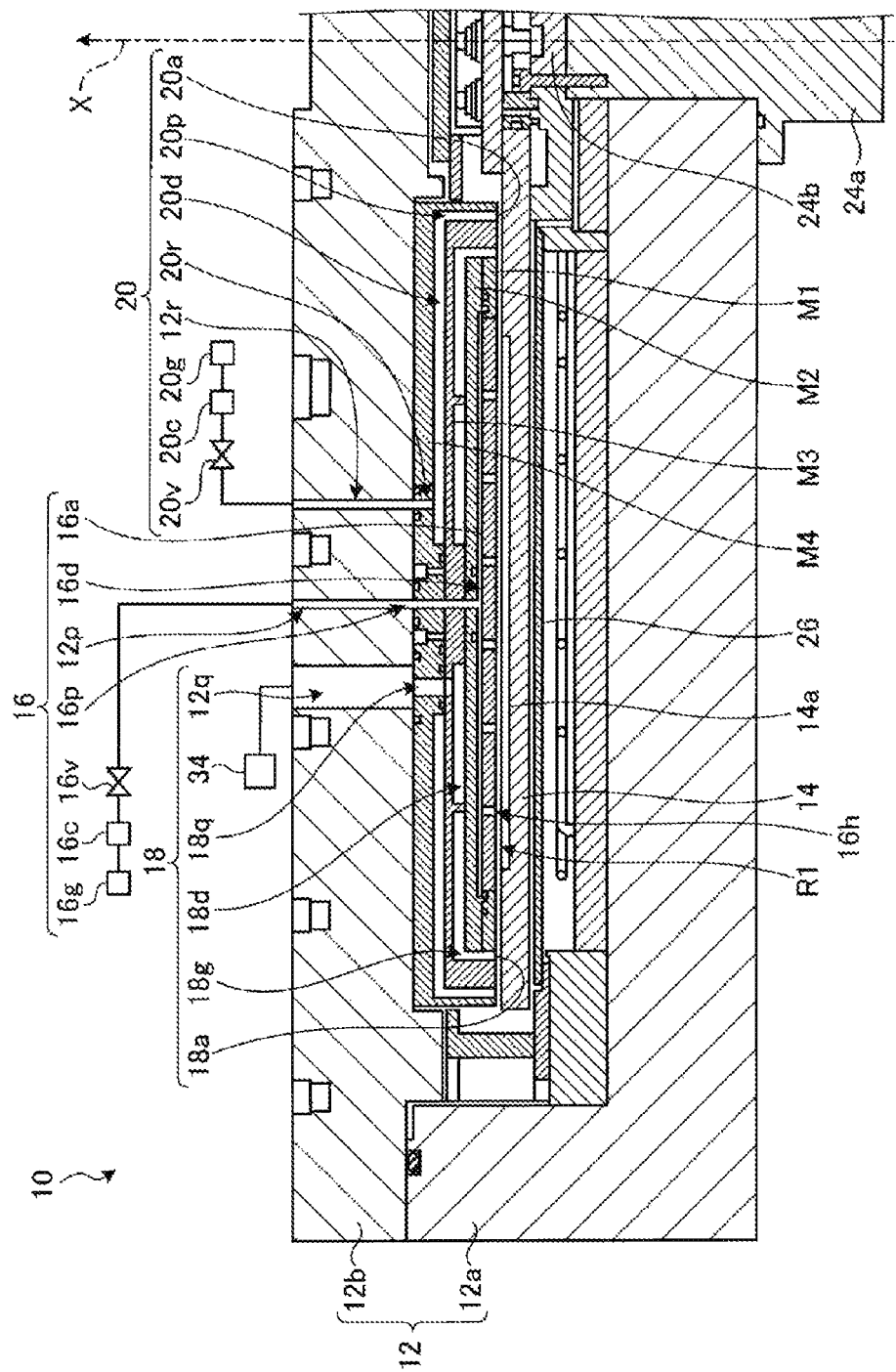
FIG. 4 is an enlarged sectional view of the portion existing at the left side of an axis X in FIG. 3.
Figure 5:
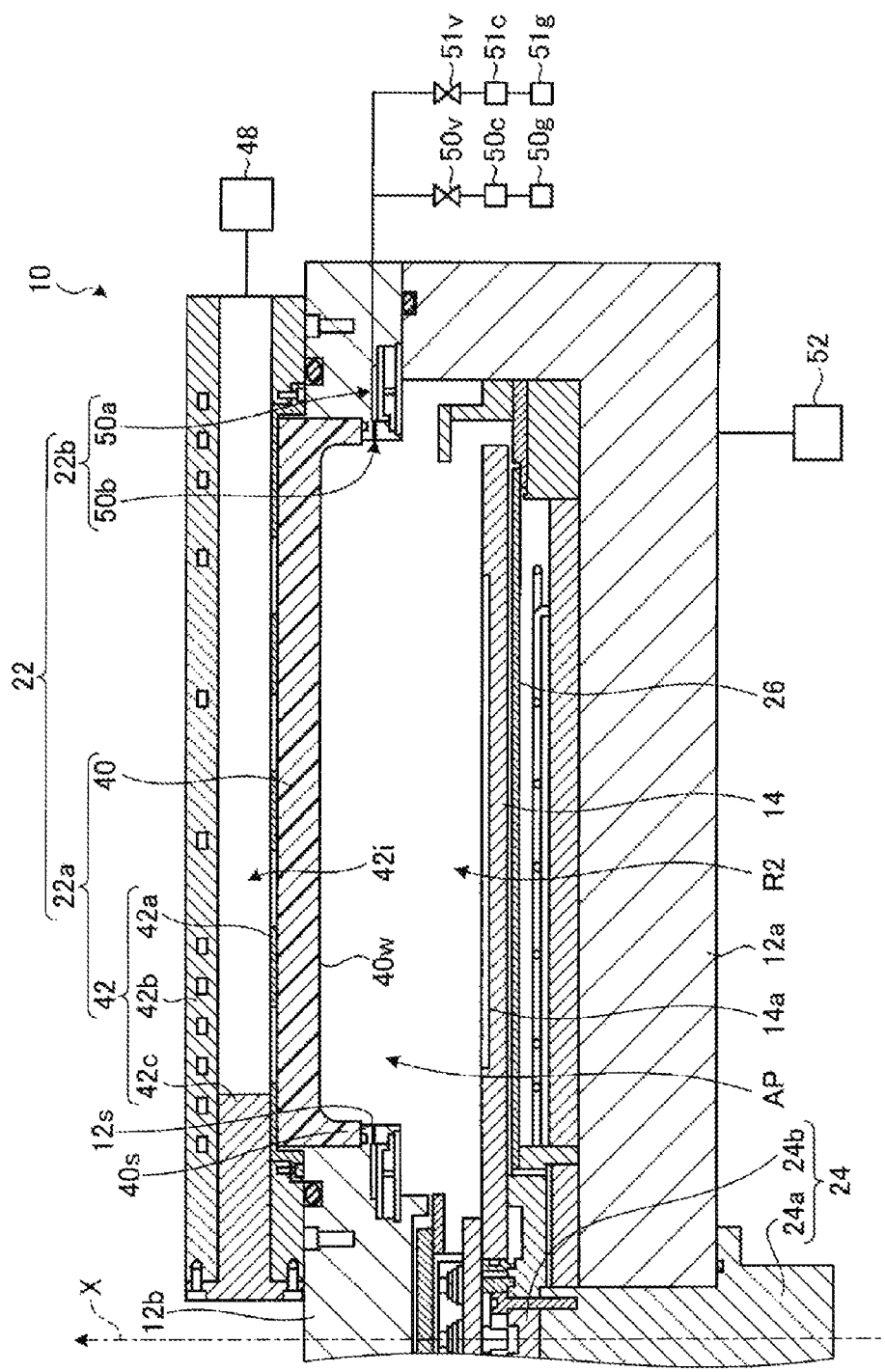
FIG. 5 is an enlarged sectional view of the portion existing at the right side of the axis X in FIG. 3.

FIG. 1 is a top view schematically showing a substrate processing apparatus 10 according to a first embodiment. FIG. 2 is a plane view showing a state in which a top portion of a process vessel 12 is removed from the substrate processing apparatus 10 shown in FIG. 1. FIG. 3 is a sectional view taken along line I-I in the substrate processing apparatus 10 shown in FIG. 1. FIG. 4 is an enlarged sectional view of the portion existing at the left side of an axis X in FIG. 3. FIG. 5 is an enlarged sectional view of the portion existing at the right side of the axis X in FIG. 3. The substrate processing apparatus 10 shown in FIGS. 1 to 5 essentially includes a process vessel 12, a mounting stand 14, a precursor gas supply unit 16, an exhaust unit 18, a purge gas supply unit 20, and a plurality of plasma generating units 22.

The process vessel 12 is a substantially cylindrical vessel having a center axis coinciding with a vertical axes X. The process vessel 12 includes a process chamber C defined therein. The process chamber C includes a unit U provided with an injection part 16a. The process vessel 12 is made of metal such as Al (aluminum) or the like. The inner surface of the process vessel 12 is subjected to an anti-plasma treatment such as, e.g., an alumite treatment or a thermal spray treatment of $Y_2O_3$ (yttrium oxide).

The substrate processing apparatus 10 includes the plasma generating units 22 disposed above the process vessel 12. The plasma generating units 22 are respectively installed in three consecutive regions among five substantially-equal fan-shaped regions defined by dividing a substantially circular plane existing above the process vessel 12 about the axis X. Each of the plasma generating units 22 includes an antenna 22a configured to output microwaves. The antenna 22a includes a dielectric plate 40 disposed therein. The antenna 22a further includes a waveguide 42 installed on the dielectric plate 40. The number of divisions of the substantially circular plane existing above the process vessel 12, the number of the plasma generating units 22 installed and the position of the unit U are not limited to the ones illustrated in FIGS. 1 and 2 but may be appropriately changed.

As shown in FIG. 2, the substrate processing apparatus 10 includes the mounting stand 14 which has a plurality of substrate mounting regions 14a on the upper surface thereof. The mounting stand 14 is a substantially disc-shaped plate having a center axis coinciding with the axis X. The substrate mounting regions 14a, which are concave portions for mounting substrates W, are formed on the upper surface of the mounting stand 14. The concave portions are concentrically formed on a planar surface. In the present embodiment, for example, five concave portions are concentrically formed on the upper surface of the mounting stand 14 about the axis X. The substrates W are supported so as not to be shifted when they are disposed within the concave portions and are rotated. The concave portions have a substantially circular shape which is substantially identical with the shape of the substrates W. The diameter W1 of the concave portions is substantially equal to the diameter of the substrates W. That is to say, the diameter W1 of the concave portions may be set such that the substrates W are fitted to the concave portions and such that the substrates W are fixed and are not moved out of the fitted positions by a centrifugal force even when the mounting stand 14 is rotated.

The substrate processing apparatus 10 includes a gate valve G installed in the outer edge of the process vessel 12 such that the substrates W can be carried into and out of the process chamber C through the gate valve G by virtue of a transfer device such as a robot arm or the like. Furthermore, the substrate processing apparatus 10 includes an exhaust port 22h formed below the outer edge of the mounting stand 14. The substrate processing apparatus 10 keeps the internal pressure of the process chamber C at a desired pressure by evacuating the interior of the process chamber C through the exhaust port 22h.

As shown in FIG. 3, the process vessel 12 includes a lower member 12a and an upper member 12b. The lower member 12a has an upwardly-opened substantially-cylindrical shape and forms a recess portion including a sidewall and a bottom wall for defining the process chamber C. The upper member 12b is a lid which has a substantially cylindrical shape and which forms the process chamber C by covering and closing an upper opening of the recess portion of the lower member 12a. An elastic sealing member, e.g., an O-ring, for sealing the process chamber C may be installed in an outer periphery portion between the lower member 12a and the upper member 12b.

The mounting stand 14 is rotationally driven about the axis X by a drive mechanism 24. The drive mechanism 24 includes a driving device 24a such as a motor or the like and a rotating shaft 24b. The drive mechanism 24 is installed in the lower member 12a of the process vessel 12.

The rotating shaft 24b extends into the process chamber C along a center axis coinciding with the axis X. The rotating shaft 24b is rotated, e.g., clockwise, about the axis X by a driving force transmitted from the driving device 24a. The central portion of the mounting stand 14 is supported by the rotating shaft 24b. Thus, upon rotating the rotating shaft 24b, the mounting stand 14 is rotated about the axis X. An elastic sealing member, such as an O-ring or the like, for sealing the process chamber C may be installed between the lower member 12a of the process vessel 12 and the drive mechanism 24.

The substrate processing apparatus 10 includes a heater 26 disposed below the mounting stand 14 within the process chamber C and configured to heat the substrates W mounted in the substrate mounting regions 14a. Specifically, the heater 26 heats the mounting stand 14, thereby heating the substrates W. The process chamber C includes a first region R1 arranged in a planar shape on a circumference centered at the axis X (see FIG. 2) and a second region R2. Upon rotating the mounting stand 14, the substrates W mounted in the substrate mounting regions 14a pass through the first region R1 and the second region R2.

For example, as shown in FIG. 4, the substrate processing apparatus 10 includes the precursor gas supply unit 16 disposed above the first region R1 so as to face the upper surface of the mounting stand 14. The precursor gas supply unit 16 includes an injection part 16a. That is to say, the region facing the injection part 16a among the regions included in the process chamber C is the first region R1.

The injection part 16a includes a plurality of injection holes 16h. The precursor gas supply unit 16 supplies a precursor gas to the first region R1 through the plurality of injection holes 16h. As the precursor gas is supplied to the first region R1, the atoms or molecules of the precursor gas is chemisorbed onto the surfaces of the substrates W passing through the first region R1. The precursor gas is, e.g., a gas which contains at least silane. The precursor gas is, e.g., DCS (dichlorosilane), monochlorosilane or trichlorosilane. For example, if the precursor gas is DCS, Si (silicon) is chemisorbed onto the surfaces of the substrates W as the substrates W pass through the first region R1.

An exhaust hole 18a of the exhaust unit 18 is formed above the first region R1 so as to face the upper surface of the mounting stand 14. The exhaust hole 18a is formed around the injection part 16a. The exhaust unit 18 exhausts the gas existing within the process chamber C through the exhaust hole 18a using the operation of an exhaust device 34 such as a vacuum pump or the like.

An injection hole 20a of the purge gas supply unit 20 is formed above the first region R1 so as to face the upper surface of the mounting stand 14. The injection hole 20a is formed around the exhaust hole 18a. The purge gas supply unit 20 supplies a purge gas to the first region R1 through the injection hole 20a. The purge gas supplied by the purge gas supply unit 20 is an inert gas such as, e.g., Ar (argon) or the like. As the purge gas is injected toward the surfaces of the substrates W, the atoms or molecules of the precursor gas (the residual gas components) excessively adsorbed onto the substrates W are removed from the substrates W. Thus, layers onto which a specified amount of atoms or molecules of the precursor gas is adsorbed are formed on the surfaces of the substrates W.

The substrate processing apparatus 10 injects the purge gas from the injection hole 20a and exhausts the purge gas from the exhaust hole 18a along the surface of the mounting stand 14. Thus, the exhaust unit 18 restrains the precursor gas supplied to the first region R1 from being leaked out of the first region R1. Since the substrate processing apparatus 10 injects the purge gas from the injection hole 20a and exhausts the purge gas from the exhaust hole 18a along the surface of the mounting stand 14, it is possible to restrain the reaction gas or radicals of the reaction gas supplied to the second region R2 from infiltrating into the first region R1. That is to say, the substrate processing apparatus 10 is configured to isolate the first region R1 and the second region R2 using the injection of the purge gas from the purge gas supply unit 20 and the exhaust operation of the exhaust unit 18.

The substrate processing apparatus 10 is provided with a unit U which includes the injection part 16a, the exhaust hole 18a and the injection hole 20a. That is to say, the injection part 16a, the exhaust hole 18a and the injection hole 20a are formed as portions which constitute the unit U. For example, as shown in FIG. 4, the unit U is configured by sequentially stacking a first member M1, a second member M2, a third member M3 and a fourth member M4. The unit U is installed in the process vessel 12 so as to make contact with the lower surface of the upper member 12b of the process vessel 12.

For example, as shown in FIG. 4, a gas supply path 16p extending through the second member M2, the third member M3 and the fourth member M4 is formed in the unit U. The gas supply path 16p is connected at its upper end to a gas supply path 12p installed in the upper member 12b of the process vessel 12. A gas supply source 16g for supplying a precursor gas is connected to the gas supply path 12p through a valve 16v and a flow rate controller 16c such as a mass flow controller or the like. Furthermore, the lower end of the gas supply path 16p is connected to a space 16d defined between the first member M1 and the second member M2. The injection holes 16h of the injection part 16a installed in the first member M1 are connected to the space 16d.

A gas supply path 20r extending through the fourth member M4 is formed in the unit U. The gas supply path 20r is connected at its upper end to a gas supply path 12r installed in the upper member 12b of the process vessel 12. A purge gas supply source 20g is connected to the gas supply path 12r through a valve 20v and a flow rate controller 20c such as a mass flow controller or the like.

In the unit U, the lower end of the gas supply path 20r is connected to a space 20d defined between the lower surface of the fourth member M4 and the upper surface of the third member M3. Furthermore, the fourth member M4 is configured to define a recess portion which accommodates the first member M1, the second member M2 and the third member M3. A gap 20p is formed between a side surface of the fourth member M4 defining the recess portion and a side surface of the third member M3. The gap 20p is connected to the space 20d.

An exhaust path 18q extending through the third member M3 and the fourth member M4 is formed in the unit U. The exhaust path 18q is connected at its upper end to an exhaust path 12q formed in the upper member 12b of the process vessel 12. The exhaust path 12q is connected to the exhaust device 34 such as a vacuum pump or the like. Furthermore, the exhaust path 18q is connected at it lower end to a space 18d defined between the lower surface of the third member M3 and the upper surface of the second member M2.

The third member M3 includes a recess portion which accommodates the first member M1 and the second member M2. A gap 18g is formed between an inner surface of the third member M3 defining the recess portion of the third member M3 and side end surfaces of the first member M1 and second member M2. The space 18d is connected to the gap 18g. The lower end of the gap 18g serves as the exhaust hole 18a. The substrate processing apparatus 10 injects a purge gas from the injection hole 20a and exhausts the purge gas from the exhaust hole 18a along the surface of the mounting stand 14, thereby restraining the precursor gas supplied to the first region R1 from being leaked out of the first region R1.

For example, as shown in FIG. 5, the substrate processing apparatus 10 includes the plasma generating units 22 disposed above the second region R2, which is an opening of the upper member 12b, so as to face the upper surface of the mounting stand 14. For example, as shown in FIG. 2, the opening of the plasma generating unit 22 has a substantially fan-shape. In the present embodiment, three openings are formed in the upper member 12b. The substrate processing apparatus 10 includes, e.g., three plasma generating units 22.

In the reaction process, the plasma generating units 22 supplies a reaction gas and microwaves to the second region R2, thereby forming plasma of the reaction gas in the second region R2. If a nitrogen-containing gas is used as the reaction gas, the active species generated by the plasma react with the layers of atoms or molecules chemisorbed onto the substrates W, thereby nitriding the layers of atoms or molecules chemisorbed onto the substrates W. As the reaction gas, it may be possible to use a nitrogen-containing gas such as a $N_2$ (nitrogen) gas or a $NH_3$ (ammonia) gas, a $H_2$ (hydrogen) gas, or a mixture gas obtained by appropriately mixing these gases. In the present embodiment, a mixture gas of the $NH_3$ gas and the $H_2$ gas is used as the reaction gas. In the reaction process, the flow rate of the $NH_3$ gas is, e.g., 1,500 sccm and the flow rate of the $H_2$ gas is, e.g., 150 sccm.

In the modifying process, the plasma generating units 22 supply a modifying gas and microwaves to the second region R2, thereby generating plasma of the modifying gas in the second region R2. The nitride films formed on the surfaces of the substrates W can be modified by the active species generated by the plasma of the modifying gas. As the modifying gas, it may be possible to use one of a $N_2$ gas, a $NH_3$ gas, an Ar (argon) gas and a $H_2$ gas, or a mixture gas obtained by appropriately mixing these gases. In the present embodiment, the $H_2$ gas is used as the modifying gas. In the modifying process, the flow rate of the $H_2$ gas is, e.g., 150 sccm.

For example, as shown in FIG. 5, in the plasma generating units 22, a dielectric plate 40 is hermetically disposed so as to close an aperture AP. A waveguide 42 is disposed on the dielectric plate 40. An internal space 42i, which is a waveguide path for propagating microwaves, is formed within the waveguide 42. An antenna 22a for supplying microwaves to the second region R2 is installed on the upper surface between the waveguide 42 and the dielectric plate 40. The dielectric plate 40 is a substantially plate-shaped member made of a dielectric material such as $SiO_2$ (quartz) or the like. The dielectric plate 40 is installed so as to face the second region R2. The dielectric plate 40 is supported on the upper member 12b of the process vessel 12.

For example, as shown in FIG. 5, an aperture AP is formed in the upper member 12b of the process vessel 12 such that the dielectric plate 40 is exposed to the second region R2. The plane size of the upper portion of the aperture AP is larger than the plane size of the lower portion of the aperture AP. The term "plane size" refers to the cross-sectional area on a plane orthogonal to the axis X. A substantially L-like step surface 12s is formed in the portion of the upper member 12b which defines the aperture AP. The edge portion of the dielectric plate 40 serves as a supported portion 40s which makes air-tight contact with the step surface 12s through an O-ring or the like. As the supported portion 40s makes contact with the step surface 12s, the dielectric plate 40 is supported on the upper member 12b.

In the dielectric plate 40 supported by the upper member 12b, the portion facing the mounting stand 14 through the second region R2, namely the portion facing the second region R2, serves as a dielectric window 40w. The waveguide 42 is installed on the dielectric plate 40 such that the internal space 42i radially extends with respect to the axis X.

A slot plate 42a is a plate-shaped member made of metal. The slot plate 42a forms a lower surface of the internal space 42i. The slot plate 42a makes contact with the upper surface of the dielectric plate 40 and covers the upper surface of the dielectric plate 40. The slot plate 42a includes a plurality of slot holes 42s formed in the portion which defines the internal space 42i.

A metal-made top member 42b is installed above the slot plate 42a so as to cover the slot plate 42a. The top member 42b forms an upper surface of the internal space 42i of the waveguide 42. The top member 42b is screw-fixed to the upper member 12b such that the slot plate 42a and the dielectric plate 40 are sandwiched between the top member 42b and the upper member 12b of the process vessel 12.

An end member 42c is a metal-made member. The end member 42c is installed at one longitudinal end of the waveguide 42. That is to say, the end member 42c is installed at one ends of the slot plate 42a and the top member 42b so as to close one end of the internal space 42i. A microwave generator 48 is connected to the other end of the waveguide 42.

The microwave generator 48 generates microwaves of, e.g., about 2.45 GHz, and supplies the microwaves to the waveguide 42. The microwaves generated by the microwave generator 48 are propagated within the internal space 42i of the waveguide 42 and are propagated to the dielectric plate 40 through the slot holes 42s of the slot plate 42a. The microwaves propagated to the dielectric plate 40 are transmitted through the dielectric plate 40 and supplied to the second region R2.

The modifying gas is one of a $N_2$ gas, a $NH_3$ gas, an Ar gas and a $H_2$ gas, or a mixture gas obtained by appropriately mixing these gases. A process gas supply unit 22b is installed at the inner circumference side of the opening of the upper member 12b. The process gas supply unit 22b includes a gas supply part 50a and an injection part 50b.

The gas supply part 50a is formed within the upper member 12b of the process vessel 12 so as to extend, e.g., around the aperture AP. The injection part 50b for injecting a reaction gas or a modifying gas toward the lower side of the dielectric window 40w is formed so as to communicate with the gas supply part 50a. A gas supply source 50g is connected to the gas supply part 50a through a valve 50v and a flow rate control unit 50c such as a mass flow controller or the like. Furthermore, a gas supply source 51g is connected to the gas supply part 50a through a valve 51v and a flow rate control unit 51c such as a mass flow controller or the like. In the present embodiment, the gas supply source 50g supplies, e.g., a $NH_3$ gas and the gas supply source 51g supplies, e.g., a $H_2$ gas.

In a case where a reaction gas is supplied to the second region R2, the valves 50v and 51v are controlled to come into an open state. The flow rate control unit 50c supplies a $NH_3$ gas from the gas supply source 50g to the second region R2 at a specified flow rate. The flow rate control unit 51c supplies a $H_2$ gas from the gas supply source 51g to the second region R2 at a specified flow rate. Thus, a reaction gas, which is a mixture gas of the $NH_3$ gas supplied at a specified flow rate and the $H_2$ gas supplied at a specified flow rate, is supplied to the second region R2.

In a case where a modifying gas is supplied to the second region R2, the valve 50v is controlled to come into a closed state and the valve 51v is controlled to come into an open state. The flow rate control unit 51c supplies a $H_2$ gas from the gas supply source 51g to the second region R2 at a specified flow rate. Thus, a modifying gas, which is the $H_2$ gas supplied at a specified flow rate, is supplied to the second region R2.

In a state in which the reaction gas or the modifying gas is supplied to the second region R2 by the process gas supply unit 22b, each of the plasma generating units 22 causes the antenna 22a to supply microwaves to the second region R2, thereby generating plasma of the reaction gas or the modifying gas in the second region R2.

If there is a plurality of plasma generating units 22, it is necessary to supply the gases to the respective plasma generating units 22. In this case, a process gas is divisionally supplied to the plasma generating units 22. Therefore, as compared with a case where gas supply sources and flow rate control units are installed in the respective plasma generating units 22, it is possible to reduce the cost of the substrate processing apparatus 10. Since the gas supplied from the respective plasma generating units 22 is used in common, there is no possibility that the processing performance is deteriorated due to the mixture of different process gases.

For example, as shown in FIG. 2, the angular extent over which the second region R2 extends in the circumferential direction of the axis X is set larger than the angular extent over which the first region R1 extends in the circumferential direction. Thus, the layers of atoms or molecules adsorbed onto the substrates W are exposed for a long time to the plasma of the reaction gas or the modifying gas generated in the second region R2, whereby the layers are efficiently processed. For example, the layers of Si adsorbed onto the substrates W are efficiently nitrided by free radicals (radicals) of $N_2$.

For example, as shown in FIG. 2, the exhaust port 22h is formed in the lower member 12a of the process vessel 12 at a position below the outer edge of the mounting stand 14. An exhaust device 52 is connected to the exhaust port 22h. In the substrate processing apparatus 10, the pressure in the second region R2 is kept at a target pressure by the evacuation from the exhaust port 22h through the operation of the exhaust device 52.

For example, as shown in FIG. 3, the substrate processing apparatus 10 includes a control unit 60 for controlling the respective constituent elements of the substrate processing apparatus 10. The control unit 60 may be a computer which includes a control device such as a CPU (Central Processing Unit) or the like, a memory device such as a memory or the like, an input/output device, and so forth. In the control unit 60, the CPU is operated pursuant to a control program stored in a memory, thereby controlling the respective constituent elements of the substrate processing apparatus 10.

The control unit 60 transmits a control signal for controlling the rotation speed of the mounting stand 14, to the driving device 24a. Furthermore, the control unit 60 sends a control signal for controlling the temperature of the substrates W, to a power source connected to the heater 26. Moreover, the control unit 60 sends a control signal for controlling the flow rate of the precursor gas, to the valve 16v and the flow rate controller 16c. In addition, the control unit 60 transmits a control signal for controlling the exhaust amount of the exhaust device 34 connected to the exhaust hole 18a, to the exhaust device 34.

Furthermore, the control unit 60 transmits a control signal for controlling the flow rate of the purge gas, to the valve 20v and the flow rate controller 20c. Moreover, the control unit 60 transmits a control signal for controlling the power of microwaves, to the microwave generator 48. Furthermore, the control unit 60 transmits a control signal for controlling the flow rate of, e.g., a $NH_3$ gas included in the reaction gas, to the valve 50v and the flow rate control unit 50c, and transmits a control signal for controlling the flow rate of, e.g., a $H_2$ gas included in the reaction gas, to the valve 51v and the flow rate control unit 51c. Moreover, the control unit 60 transmits a control signal for controlling the flow rate of the modifying gas, to the valve 51v and the flow rate control unit 51c. In addition, the control unit 60 transmits a control signal for controlling the exhaust amount, to the exhaust device 34 and the exhaust device 52.

Figure 6:
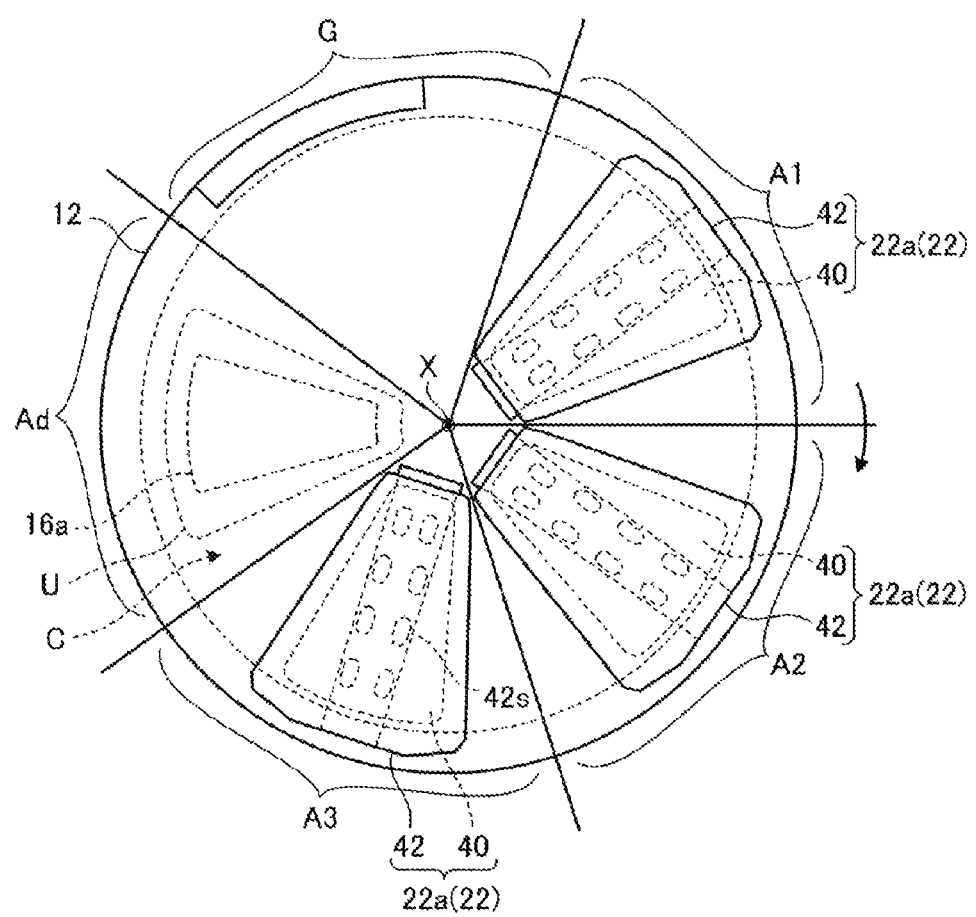
FIG. 6 is a view showing one example of each of five regions defined by dividing the interior of the process vessel.

FIG. 6 is a view showing one example of each of five regions defined by dividing the interior of the process vessel 12. Referring to FIG. 6, the region in which the unit U is disposed will be defined as a region Ad. The region which is positioned adjacent to the region Ad at the clockwise side in FIG. 6 and in which the gate valve G is disposed will be defined as a region G. The region which is positioned adjacent to the region G at the clockwise side in FIG. 6 and in which the plasma generating unit 22 is disposed will be defined as a region A1. The region which is positioned adjacent to the region A1 at the clockwise side in FIG. 6 and in which the plasma generating unit 22 is disposed will be defined as a region A2. The region which is positioned adjacent to the region A2 at the clockwise side in FIG. 6 and in which the plasma generating unit 22 is disposed will be defined as a region A3.

In the present embodiment, the control unit 60 transmits a control signal for achieving a rotation speed at which the mounting stand 14 makes one revolution for a specified number of seconds, to the driving device 24a. The driving device 24a rotates the mounting stand 14 at a rotation speed at which the mounting stand 14 makes one revolution for a specified number of seconds. In the present embodiment, the control unit 60 transmits a control signal for rotating the mounting stand 14 clockwise when seen from above, to the driving device 24a.

In the example shown in FIG. 6, the control unit 60 transmits a control signal for achieving a rotation speed at which the mounting stand 14 makes one revolution for, e.g., 5 seconds, to the driving device 24a. The driving device 24a rotates the mounting stand 14 at a rotation speed at which the mounting stand 14 makes one revolution for 5 seconds, namely at 12 rpm.

In the region Ad, the precursor gas is supplied from the injection part 16a of the unit U. Exhaust is performed from the exhaust hole 18a formed around the injection part 16a. The purge gas is supplied from the injection hole 20a formed around the exhaust hole 18a. Upon rotating the mounting stand 14, the substrates W pass below the injection part 16a of the unit U disposed within the region Ad, thereby performing an adsorption process in which the precursor gas is chemisorbed onto the substrates W. Furthermore, upon rotating the mounting stand 14, the substrates W pass below the exhaust hole 18a of the unit U disposed within the region Ad, thereby performing a purge process in which the atoms or molecules of the precursor gas excessively adsorbed onto the substrates W are removed from the substrates W.

In the regions A1 to A3, the reaction gas or the modifying gas is supplied from the process gas supply unit 22b while the microwaves are supplied by the antenna 22a. Thus, plasma of the reaction gas or the modifying gas is generated in the regions A1 to A3. In a case where the reaction gas is supplied from the process gas supply unit 22b to the regions A1 to A3, upon rotating the mounting stand 14, the substrates W pass through the regions A1 to A3 in which the plasma of the reaction gas is generated, thereby performing a reaction process in which the layers of atoms or molecules chemisorbed onto the substrates W are nitrided. In a case where the supply of the reaction gas from the process gas supply unit 22b is stopped and the modifying gas is supplied from the process gas supply unit 22b to the regions A1 to A3, upon rotating the mounting stand 14, the substrates W pass through the regions A1 to A3 in which the plasma of the modifying gas is generated, thereby performing a modifying process in which the nitride films of the substrates W are modified.

In the region G, there is installed a mechanism for detecting the positions of the substrates W. For that reason, a shower head (a unit U) or a plasma generating unit 22 cannot be installed. In the rotation direction of the mounting stand 14, the region G is disposed adjacent to the back side of the region Ad in which a shower head is installed. Thus, if the purge performed in the region Ad is insufficient, the region G serves as a buffer region between the region Ad in which the purge process is performed with respect to the substrates W and the region A1 in which the reaction process or the modifying process is performed with respect to the substrates W. Accordingly, while the substrates W are moved to the region A1 after the purge process, it is possible to reduce impurities such as Cl and the like remaining near the substrates W. This makes it possible to improve the quality of films formed on the substrates W.

Upon rotating the mounting stand 14, the substrates W are subjected to an adsorption process and a purge process in the region Ad. After the substrates W pass through the region G, if the plasma of the reaction gas is generated in the regions A1 to A3, the substrates W are subjected to a reaction process while the substrates W pass through the regions A1 to A3. On the other hand, if the plasma of the modifying gas is generated in the regions A1 to A3, the substrates W are subjected to a modifying process while the substrates W pass through the regions A1 to A3 along with the rotation of the mounting stand 14.

In the present embodiment, with respect to the process gas supply unit 22b, the control unit 60 executes a repetition control of repeating a first operation for supplying the reaction gas to the regions A1 to A3 for a first time and a second operation for supplying the modifying gas to the regions A1 to A3 for a second time. While the reaction gas is supplied to the regions A1 to A3, the plasma of the reaction gas is generated in the regions A1 to A3. While the modifying gas is supplied to the regions A1 to A3, the plasma of the modifying gas is generated in the regions A1 to A3.

In this regard, the control unit 60 transmits a control signal to the valves 50v and 51v and the flow rate control units 50c and 51c so as to repeat the first operation and the second operation based on the values of m and n which satisfy, e.g., the following relational expression (1):

$$xk \pm 1 = m + n \tag{1},$$

where x is the time required for the mounting stand 14 to make one revolution, m is the time (seconds, a natural number) during which the reaction gas is supplied to the regions A1 to A3, n is the time (seconds, a natural number) during which the modifying gas is supplied to the regions A1 to A3, and k is an arbitrary natural number.

Thus, the process gas supply unit 22b repeats an operation for supplying the reaction gas to the regions A1 to A3 for m seconds and an operation for stopping the supply of the reaction gas and supplying the modifying gas to the regions A1 to A3 for n seconds. The relational expression (1) noted above may be either xk+1=m+n or xk−1=m+n.

In the relational expression (1) noted above, the m+n denotes the time required in performing one cycle of supply and cutoff of the reaction gas. Inasmuch as the time required for the mounting stand 14 to make one revolution is x seconds, the xk denotes the time required for the mounting stand 14 to make k revolutions. Thus, the relational expression (1) noted above means that, if the mounting stand 14 makes k revolutions, a deviation of 1 second exists between the time required for the mounting stand 14 to make k revolutions and the time required in performing one cycle of supply and cutoff of the reaction gas.

It is now assumed that the division number of the process vessel 12 is y. In the present embodiment, the number of seconds x of the time required for the mounting stand 14 to make one revolution is equal to the division number y of the process vessel 12. That is to say, x=y. Thus, the time required for the substrates W to pass through each of the divided compartments within the process vessel 12 is 1 second. Accordingly, in the relational expression (1) noted above, if the mounting stand 14 makes k revolutions, a deviation of 1 second, namely a deviation corresponding to the time required for the substrates W to pass through one compartment within the process vessel 12, exists between the time required for the mounting stand 14 to make k revolutions and the time required in performing one cycle of supply and cutoff of the reaction gas.

If the cycle of supply and cutoff of the reaction gas is repeated x times, the cumulative value of the deviation between the time required for the mounting stand 14 to make k revolutions and the time required in performing one cycle of supply and cutoff of the reaction gas becomes equal to the time required for the substrates W to pass through y compartments within the process vessel 12, namely the time corresponding to one lap. In an alternative example, the number of seconds of the time required for the mounting stand 14 to make one revolution may not be equal to the division number y of the process vessel 12.

In the present embodiment, when supplying a reaction gas to the regions A1 to A3, the control unit 60 controls the flow rate control unit 50c and the flow rate control unit 51c such that a mixture gas of a $NH_3$ gas having a flow rate of, e.g., 1,500 sccm and a $H_2$ gas having a flow rate of, e.g., 150 sccm is supplied as the reaction gas. When supplying a modifying gas to the regions A1 to A3, the control unit 60 controls the flow rate control unit 51c such that a $H_2$ gas having a flow rate of, e.g., 150 sccm is supplied as the modifying gas.

If the supply of the $NH_3$ gas included in the reaction gas is stopped or the supply of the $NH_3$ gas thus stopped is resumed while the substrates W pass through the regions A1 to A3, a period during which the flow rate of the $NH_3$ gas has, e.g., an intermediate value between 0 sccm and 1,500 sccm is generated. In this period, there may be a case where desired nitride films are not formed on the substrates W exposed to the plasma of the reaction gas. If the time required for the mounting stand 14 to make one revolution is equal to the time required in performing one cycle of supply and cutoff of the reaction gas, the substrates W passing through the regions A1 to A3 in the period during which the flow rate of the $NH_3$ gas has, e.g., an intermediate value between 0 sccm and 1,500 sccm, are designated as specific substrates W among the substrates W mounted on the mounting stand 14. Thus, the film quality of the specific substrates W among the substrates W mounted on the mounting stand 14 becomes poor.

In contrast, in the substrate processing apparatus 10 of the present embodiment, the time required for the mounting stand 14 to make k revolutions is deviated from the time required in performing one cycle of supply and cutoff of the reaction gas. Thus, the influence of supply and cutoff of the $NH_3$ gas can be distributed to the plurality of substrates W mounted on the mounting stand 14. This makes it possible to avoid a risk of production of substrates W having extremely poor quality. Accordingly, it is possible to produce substrates W with a small variation in quality.

In order to obtain this effect, the time which is a common multiple of the time x required for the mounting stand 14 to make one revolution and the time (m+n) required in performing one cycle of supply and cutoff of the reaction gas may be set as a process time. By arbitrarily setting the x and the (m+n), it is possible to calculate a process time complying with conditions and to perform processing for the process time. Moreover, the (m+n) may be calculated by arbitrarily setting the x and the process time. The x may be calculated by arbitrarily setting the (m+n) and the process time.

For example, if two is selected as the value of k in the relational expression (1) noted above, each time when the mounting stand 14 makes two revolutions, the time required for the mounting stand 14 to make two revolutions and the time required in performing one cycle of supply and cutoff of the $NH_3$ gas are deviated from each other by the time required for the substrates W to pass through one compartment within the process vessel 12. In this case, the division number y of the interior of the process vessel 12 is 5 and the time x required for the mounting stand 14 to make one revolution is 5 seconds in the present embodiment. Therefore, if the mounting stand 14 makes ten revolutions, the cumulative value of the deviation between the time for the mounting stand 14 to make two revolutions and the time required in performing one cycle of supply and cutoff of the $NH_3$ gas becomes equal to the time required for the substrates W to pass through five compartments within the process vessel 12, namely 5 seconds which is the time corresponding to one lap. Thus, if the mounting stand 14 makes ten revolutions, the influence of the switching of the $NH_3$ gas can be distributed to the respective substrates W mounted on the mounting stand 14. As a result, by setting the revolution number of the mounting stand 14 to become a multiple of 10, it is possible to reduce the variation in the film quality of the respective substrates W mounted on the mounting stand 14.

In the relational expression (1) noted above, the values of m and n may be arbitrarily selected within a range in which the total sum of m and n becomes equal to xk±1. If the division number y of the process vessel 12 is 5, if the number of seconds x of the time required for the mounting stand 14 to make one revolution is 5, and if the value of k is 2, xk−1=9. Therefore, it is possible to select, e.g., 7 as the m and to select, e.g., 2 as the n within a range in which the time m+n required in performing one cycle of supply and stop of the $NH_3$ gas becomes equal to 9. If 7 seconds is selected as the supply time m of the $NH_3$ gas and if 2 seconds is selected as the cutoff time n of the $NH_3$ gas, the supply timing of the $NH_3$ gas becomes, for example, as shown in FIG. 7.

Figure 7:
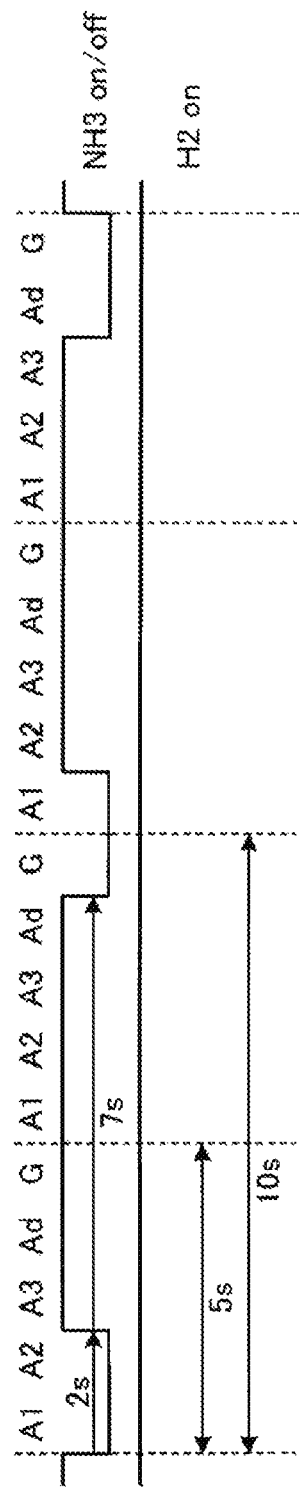
FIG. 7 is a view showing one example of a supply timing of a NH$_3$ gas in a case where the supply and cutoff of the NH$_3$ gas is controlled at 9 seconds per one cycle.

FIG. 7 is a view showing one example of a supply timing of a $NH_3$ gas in a case where the supply and cutoff of the $NH_3$ gas is controlled at 9 seconds per one cycle. Symbols "A1", "A2", "A3", "Ad" and "G" shown in FIG. 7 designate the region A1, the region A2, the region A3, the region Ad and the region G, respectively, which are defined within the process vessel 12.

As shown in FIG. 7, the $H_2$ gas used as one example of the modifying gas in the present embodiment is supplied to the regions A1 to A3 regardless of the supply or cutoff of the $NH_3$ gas. On the other hand, in the case of the $NH_3$ gas, the supply of the $NH_3$ gas to the regions A1 to A3 for 7 seconds and the cutoff of the $NH_3$ gas for 2 seconds are repeated. Since the mounting stand 14 makes one revolution for 5 seconds, the time required for the mounting stand 14 to make two revolutions is 10 seconds. The time required in performing one cycle of supply and cutoff of the $NH_3$ gas is 9 (=7+2) seconds. Thus, the time required for the mounting stand 14 to make two revolutions and the time required in performing one cycle of supply and cutoff of the $NH_3$ gas are deviated from each other by 1 second every two revolution of the mounting stand 14, namely by the time required for the substrates W to pass through one compartment within the process vessel 12. If the mounting stand 14 makes ten revolutions, the cumulative value of the deviation between 10 seconds which is the time required for the mounting stand 14 to make two revolutions and 9 seconds which is the time required in performing one cycle of supply and cutoff of the $NH_3$ gas becomes equal to the time required for the substrates W to pass through five compartments defined within the process vessel 12, namely 5 seconds which is the time corresponding to one lap.

Figure 8:
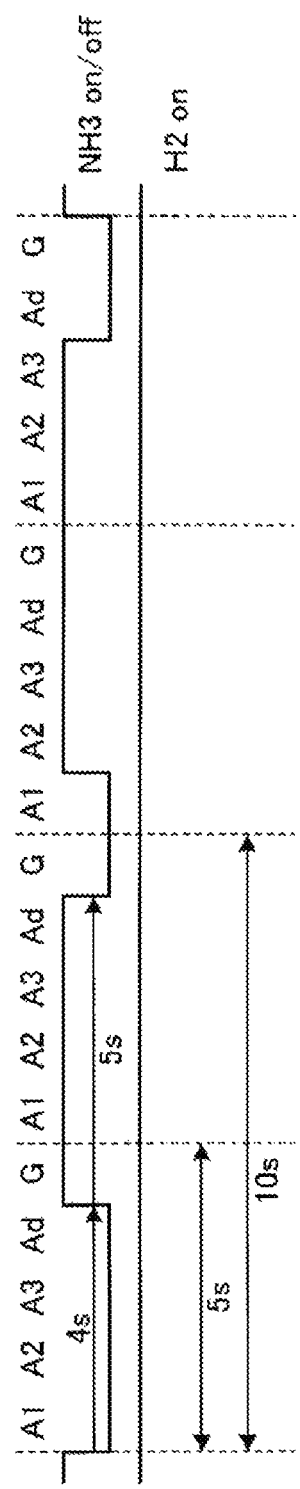
FIG. 8 is a view showing another example of the supply timing of the NH$_3$ gas in a case where the supply and cutoff of the NH$_3$ gas is controlled at 9 seconds per one cycle.

Within a range in which the time m+n required in performing one cycle of supply and cutoff of the $NH_3$ gas becomes 9 seconds, if the supply time m of the $NH_3$ gas is selected to become, e.g., 5 seconds and the cutoff time n of the $NH_3$ gas is selected to become, e.g., 4 seconds, the supply timing of the $NH_3$ gas becomes, for example, as shown in FIG. 8. FIG. 8 is a view showing another example of the supply timing of the $NH_3$ gas in a case where the supply and cutoff of the $NH_3$ gas is controlled at 9 seconds per one cycle.

As shown in FIG. 8, in the case of the $NH_3$ gas, the supply of the $NH_3$ gas to the regions A1 to A3 for 5 seconds and the cutoff of the $NH_3$ gas for 4 seconds are repeated. In the example shown in FIG. 8, the time required for the mounting stand 14 to make two revolutions and the time required in performing one cycle of supply and cutoff of the $NH_3$ gas are deviated from each other by 1 second every two revolutions of the mounting stand 14, namely by the time required for the substrates W to pass through one compartment within the process vessel 12. If the mounting stand 14 makes ten revolutions, the cumulative value of the deviation between 10 seconds which is the time required for the mounting stand 14 to make two revolutions and 9 seconds which is the time required in performing one cycle of supply and cutoff of the $NH_3$ gas becomes equal to the time required for the substrates W to pass through five compartments within the process vessel 12, namely 5 seconds which is the time corresponding to one lap.

Figure 9:
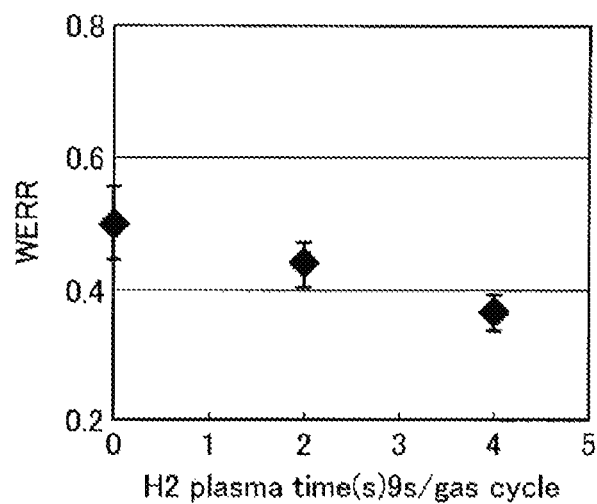
FIG. 9 is a view showing one example of a relationship between a cutoff time of a NH$_3$ gas and film quality.

FIG. 9 is a view showing one example of a relationship between a cutoff time of a $NH_3$ gas and film quality. The horizontal axis in FIG. 9 indicates the cutoff time of the $NH_3$ gas in one cycle (9 seconds) of supply and cutoff of the $NH_3$ gas. The vertical axis in FIG. 9 indicates the WERR (Wet Etching Rate Ratio).

The term "WERR" used herein refers to a value which is obtained by the following: immersing a test sample into a DHF (0.5% of hydrofluoric acid) for a predetermined time; calculating an etching rate of the test sample etched by the DHF; immersing an index sample having a thermally-oxidized film formed on a substrate identical with the test sample into a DHF; calculating an etching rate of the index sample etched by the DHF; and dividing the etching rate of the test sample by the etching rate of the index sample. If the value of the WERR becomes smaller, an etching resistance grows higher and a film quality grows better.

Referring to FIG. 9, it can be noted that, if the cutoff time of the $NH_3$ gas in one cycle (9 seconds) of supply and cutoff of the $NH_3$ gas is made longer, the value of the WERR grows smaller and the film quality grows higher.

Figure 10:
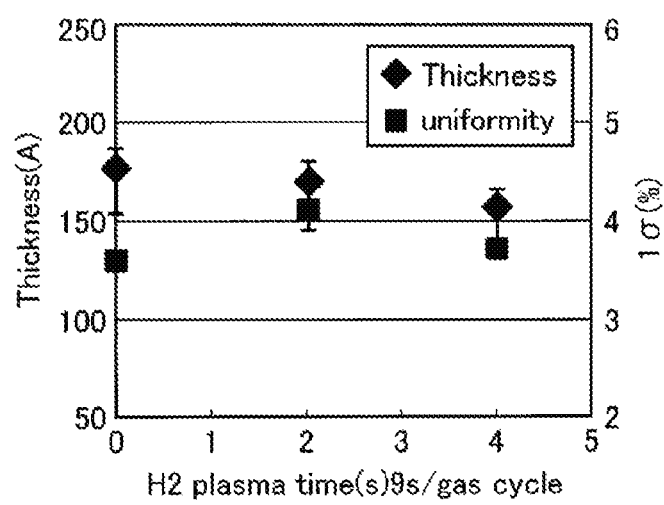
FIG. 10 is a view showing one example of a relationship between a cutoff time of a NH$_3$ gas, a film thickness and thickness uniformity.

FIG. 10 is a view showing one example of a relationship between a cutoff time of a $NH_3$ gas, a film thickness and thickness uniformity. The horizontal axis in FIG. 10 indicates the cutoff time of the $NH_3$ gas in one cycle (9 seconds) of supply and cutoff of the $NH_3$ gas. The vertical axis in FIG. 10 indicates the film thickness or the thickness uniformity ($1\sigma$).

Referring to FIG. 10, it can be seen that, even if the cutoff time of the $NH_3$ gas in one cycle (9 seconds) of supply and cutoff of the $NH_3$ gas is changed, the in-plane thickness uniformity of the substrates W does not show a great change. In FIGS. 9 and 10, the values measured when the cutoff time of the $NH_3$ gas is zero indicate the values measured in a process in which the $NH_3$ gas is not cut off, namely a process which does not perform a modifying operation.

Referring to FIGS. 9 and 10, it can be noted that, if the cutoff time of the $NH_3$ gas in one cycle of supply and cutoff of the $NH_3$ gas, namely the cutoff time of the reaction gas in one cycle of supply and cutoff of the reaction gas, is made longer, it is possible to improve the film quality while maintaining the film thickness uniformity of the substrates W.

Figure 11:
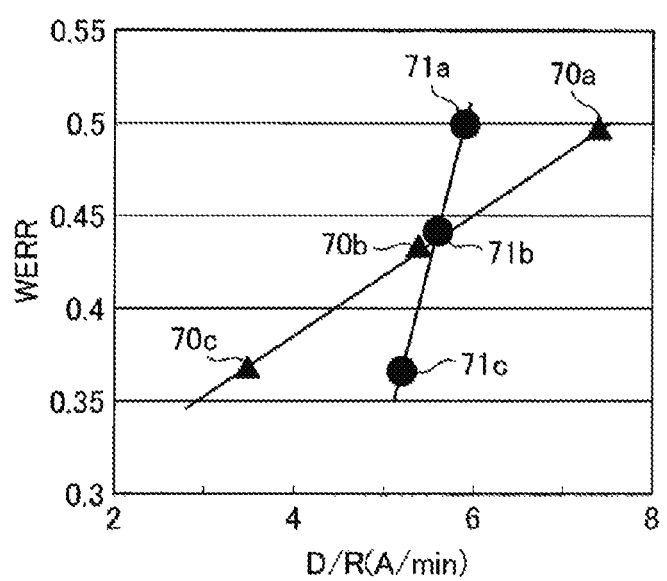
FIG. 11 is a view showing one example of a relationship between a deposition rate and film quality.

FIG. 11 is a view showing one example of a relationship between a deposition rate and a film quality. In FIG. 11, reference symbols 70a, 70b and 70c indicate the measured values at different rotation speeds of the mounting stand 14 in a process in which the $NH_3$ gas is not cut off, namely a process which does not perform a modifying operation. Reference symbol 70a indicates the measured value in a case where the rotation speed of the mounting stand 14 is 20 rpm. Reference symbol 70b indicates the measured value in a case where the rotation speed of the mounting stand 14 is 10 rpm. Reference symbol 70c indicates the measured value in a case where the rotation speed of the mounting stand 14 is 5 rpm.

Reference symbols 71a, 71b and 71c indicate the measured values at different cutoff times of the $NH_3$ gas in a case where the supply and cutoff of the $NH_3$ gas is controlled at 9 seconds per one cycle. In the measured values of reference symbols 71a, 71b and 71c, the rotation speed of the mounting stand 14 is 12 rpm. Reference symbol 71a indicates the measured value in a process in which the $NH_3$ gas is not cut off, namely a process which does not perform a modifying operation. Reference symbol 71b indicates the measured value in a case where the cutoff time of the $NH_3$ gas per one cycle is 2 seconds. Reference symbol 71c indicates the measured value in a case where the cutoff time of the $NH_3$ gas per one cycle is 4 seconds.

As is apparent from the measured values of reference symbols 70a, 70b and 70c, even when the cutoff time of the $NH_3$ gas is not set, namely even when the cutoff time of the reaction gas is not set, if the rotation speed of the mounting stand 14 is lowered, the WERR becomes small and the film quality improves. Furthermore, as is clear from the measured values of reference symbols 71a, 71b and 71c, even when the cutoff time of the $NH_3$ gas is set longer, namely even when the cutoff time of the reaction gas is set longer, the WERR becomes small and the film quality improves. If the cutoff time of the $NH_3$ gas is set longer, namely if the cutoff time of the reaction gas is set longer, as compared with a case where the rotation speed of the mounting stand 14 is lowered, it is possible to improve the film quality while suppressing reduction of the deposition rate.

Referring to FIG. 11, the measured value of reference symbol 70c and the measured value of reference symbol 71c are approximately equal in the value of WERR to each other. However, the measured value of reference symbol 71c is higher in the deposition rate than the measured value of reference symbol 70c. More specifically, the deposition rate of the measured value of reference symbol 70c is 3.5 (A/min) while the deposition rate of the measured value of reference symbol 71c is 5.2 (A/min). That is to say, the deposition rate of the measured value of reference symbol 71c is 1.5 times as high as the deposition rate of the measured value of reference symbol 70c. Accordingly, in a case of the measured value of reference symbol 71c, namely in a case of the process in which the supply time of the $NH_3$ gas per one cycle of supply and cutoff of the $NH_3$ gas is set at 5 seconds and the cutoff time of the $NH_3$ gas is set at 4 seconds, it is possible to, while maintaining about the same film quality, make the throughput 1.5 times as high as the throughput obtained in a case of the measured value of reference symbol 70c, namely in a case of the process in which the rotation speed of the mounting stand 14 is set at 5 rpm.

Second Embodiment

Figure 12:
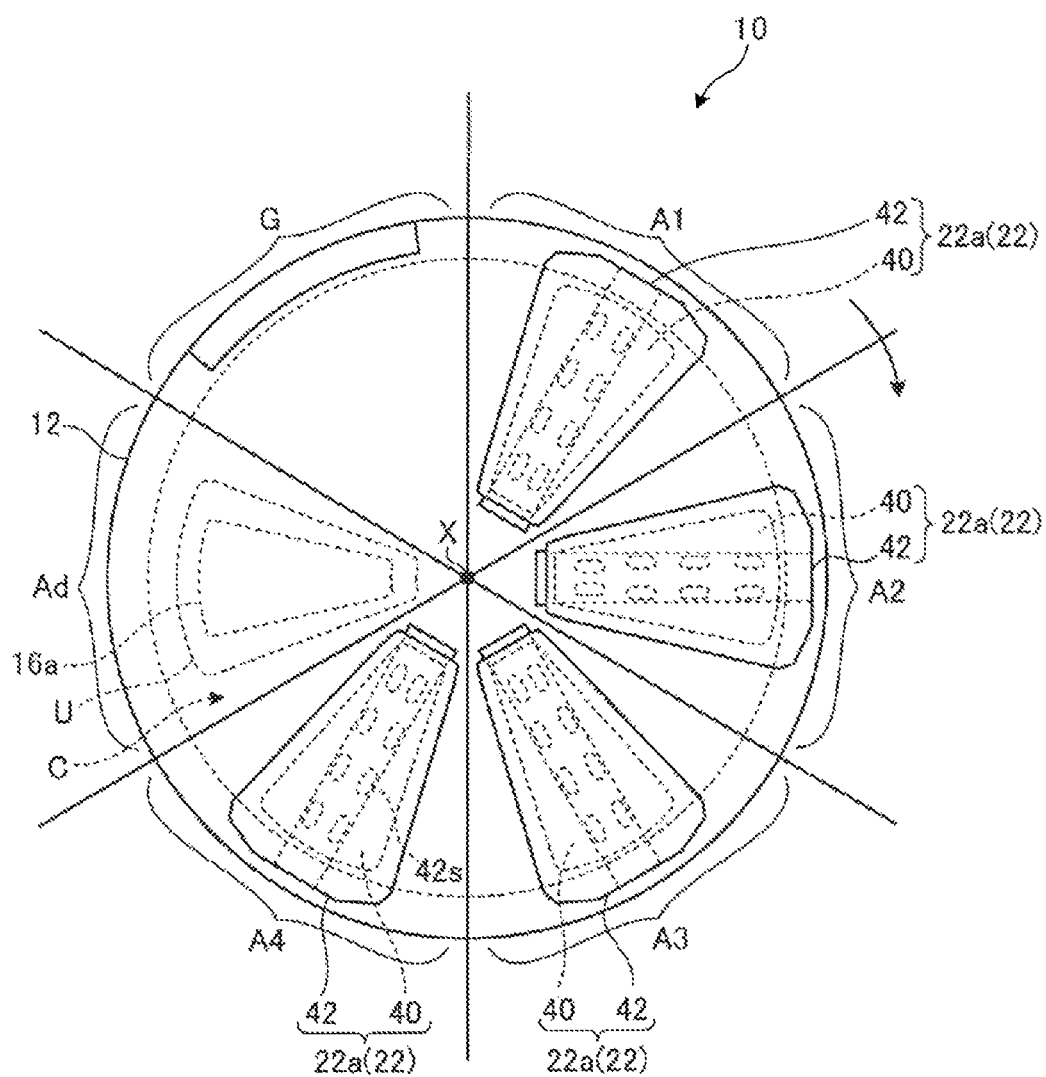
FIG. 12 is a top view schematically showing a substrate processing apparatus according to a second embodiment.

FIG. 12 is a top view schematically showing a substrate processing apparatus 10 according to a second embodiment. Except for the points to be described below, the components of FIG. 12 designated by the same reference symbols as those of FIG. 6 have functions identical with or similar to those of the components shown in FIG. 6. Thus, description will be omitted on these components.

In the present embodiment, for example, as shown in FIG. 12, the plasma generating units 22 are respectively installed in four consecutive regions among six substantially-identical fan-shaped regions defined by dividing a substantially-circular plane existing above the process vessel 12 about the axis X. Among the regions defined by dividing the interior of the process vessel 12, the region in which the unit U is disposed will be referred to as a region Ad and the region in which the gate valve G is disposed will be referred to as a region G. Furthermore, the respective regions within the plasma generating units 22 each provided with the antenna 22a will be referred to as a region A1, a region A2, a region A3 and a region A4 in the named order along the clockwise direction in FIG. 12.

As shown in FIG. 12, the division number y of the process vessel 12 is six in the present embodiment. Thus, the control unit 60 is configured to transmit, to the driving device 24a, a control signal for achieving a rotation speed (10 rpm) at which the mounting stand 14 makes one revolution in the clockwise direction for, e.g., 6 seconds. The driving device 24a rotates the mounting stand 14 at a rotation speed at which the mounting stand 14 makes one revolution for 6 seconds. The time x required for the mounting stand 14 to make one revolution is 6 seconds.

Upon rotating the mounting stand 14, the substrates W are subjected to an adsorption process and a purge process in the region Ad. After the substrates W pass through the region G, if the plasma of the reaction gas is generated in the regions A1 to A4, the substrates W are subjected to a reaction process while the substrates W pass through the regions A1 to A4. On the other hand, if the plasma of the modifying gas is generated in the regions A1 to A4, the substrates W are subjected to a modifying process while the substrates W pass through the regions A1 to A4 along with the rotation of the mounting stand 14.

For example, if two is selected as the value of k in the relational expression (1) noted above, each time when the mounting stand 14 makes two revolutions, the time required for the mounting stand 14 to make two revolutions and the time required in performing one cycle of supply and cutoff of the $NH_3$ gas are deviated from each other by the time required for the substrates W to pass through one compartment within the process vessel 12. In this case, the division number y of the interior of the process vessel 12 is 6 and the time x required for the mounting stand 14 to make one revolution is 6 seconds in the present embodiment. Therefore, if the mounting stand 14 makes twelve revolutions, the cumulative value of the deviation between the time for the mounting stand 14 to make two revolutions and the time required in performing one cycle of supply and cutoff of the $NH_3$ gas becomes equal to the time required for the substrates W to pass through six compartments within the process vessel 12, namely 6 seconds which is the time corresponding to one lap.

In the relational expression (1) noted above, if the division number y of the process vessel 12 is 6, if the number of seconds x of the time required for the mounting stand 14 to make one revolution is 6, and if the value of k is 2, xk−1=11. Therefore, it is possible to select, e.g., 6 as the m and to select, e.g., 5 as the n within a range in which the time m+n required in performing one cycle of supply and stop of the $NH_3$ gas becomes equal to 11. If 6 seconds is selected as the supply time m of the $NH_3$ gas and if 5 seconds is selected as the cutoff time n of the $NH_3$ gas, the supply timing of the $NH_3$ gas becomes, for example, as shown in FIG. 13.

Figure 13:
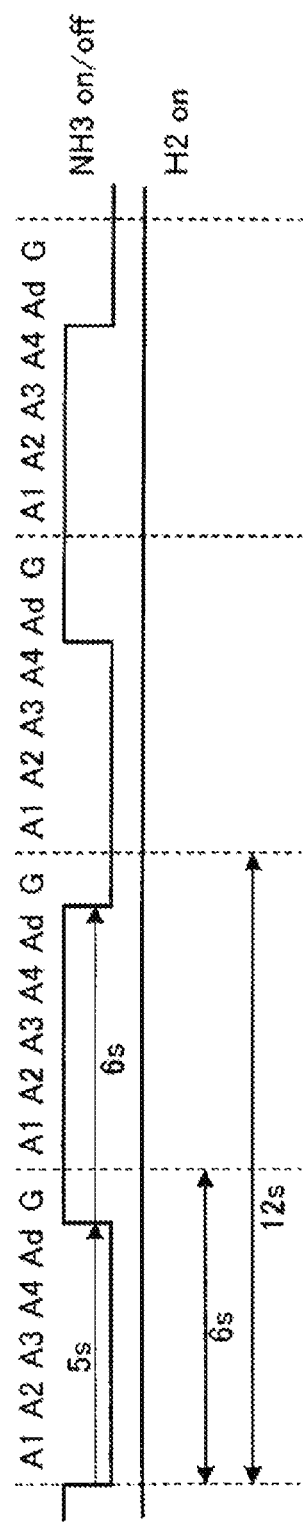
FIG. 13 is a view showing one example of a supply timing of a NH$_3$ gas in case where the supply and cutoff of the NH$_3$ gas is controlled at 11 seconds per one cycle.

FIG. 13 is a view showing one example of a supply timing of a $NH_3$ gas in a case where the supply and cutoff of the $NH_3$ gas is controlled at 11 seconds per one cycle. Symbols "A1", "A2", "A3", "A4", "Ad" and "G" shown in FIG. 13 designate the region A1, the region A2, the region A3, the region A4, the region Ad and the region G, respectively, which are defined within the process vessel 12.

As shown in FIG. 13, the $H_2$ gas used as one example of the modifying gas is supplied to the regions A1 to A4 regardless of the supply or cutoff of the $NH_3$ gas. On the other hand, in the case of the $NH_3$ gas, the supply of the $NH_3$ gas to the regions A1 to A4 for 6 seconds and the cutoff of the $NH_3$ gas for 5 seconds are repeated. Since the mounting stand 14 makes one revolution for 6 seconds, the time required for the mounting stand 14 to make two revolutions is 12 seconds. The time required in performing one cycle of supply and cutoff of the $NH_3$ gas is 11 (=6+5) seconds. Thus, the time required for the mounting stand 14 to make two revolutions and the time required in performing one cycle of supply and cutoff of the $NH_3$ gas are deviated from each other by 1 second every two revolution of the mounting stand 14, namely by the time required for the substrates W to pass through one compartment within the process vessel 12. If the mounting stand 14 makes twelve revolutions, the cumulative value of the deviation between 12 seconds which is the time required for the mounting stand 14 to make two revolutions and 11 seconds which is the time required in performing one cycle of supply and cutoff of the $NH_3$ gas becomes equal to the time required for the substrates W to pass through six compartments defined within the process vessel 12, namely 6 seconds which is the time corresponding to one lap.

Figure 14:
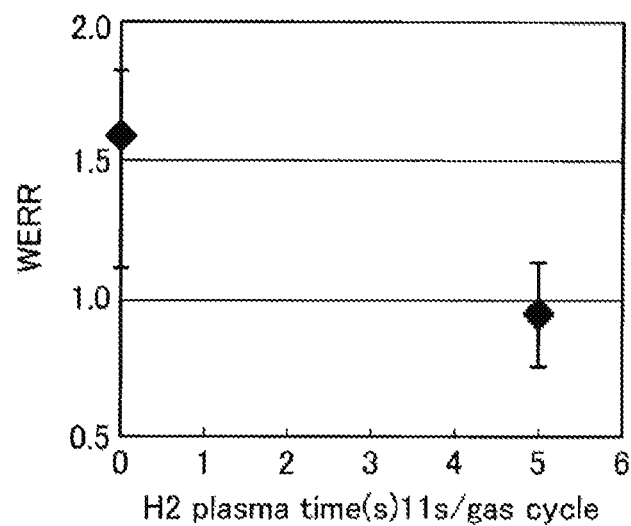
FIG. 14 is a view showing one example of a relationship between a cutoff time of a NH$_3$ gas and film quality.

FIG. 14 is a view showing one example of a relationship between a cutoff time of a $NH_3$ gas and film quality. The horizontal axis in FIG. 14 indicates the cutoff time of the $NH_3$ gas in one cycle (11 seconds) of supply and cutoff of the $NH_3$ gas. The vertical axis in FIG. 14 indicates the WERR. Referring to FIG. 14, it can be noted that, if the cutoff time of the $NH_3$ gas in one cycle (11 seconds) of supply and cutoff of the $NH_3$ gas is made longer, the value of the WERR grows smaller and the film quality grows higher.

Figure 15:
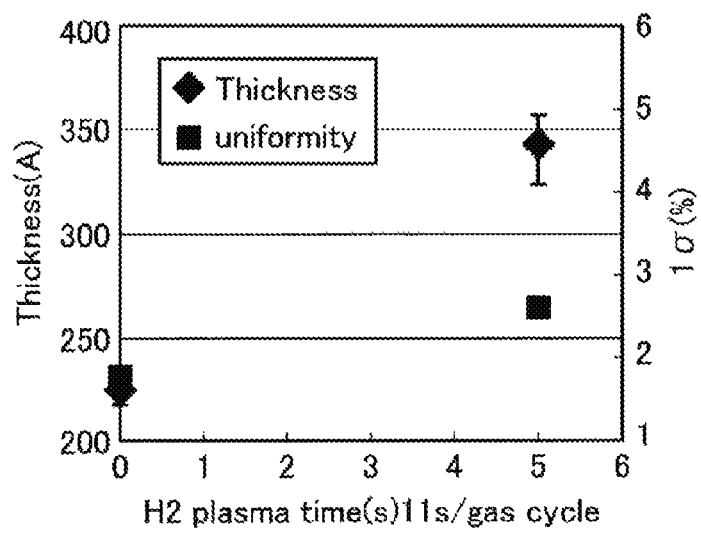
FIG. 15 is a view showing one example of a relationship between a cutoff time of a NH$_3$ gas, a film thickness and thickness uniformity.

FIG. 15 is a view showing one example of a relationship between a cutoff time of a $NH_3$ gas, a film thickness and thickness uniformity. The horizontal axis in FIG. 15 indicates the cutoff time of the $NH_3$ gas in one cycle (11 seconds) of supply and cutoff of the $NH_3$ gas. The vertical axis in FIG. 15 indicates the film thickness or the thickness uniformity (1σ). Referring to FIG. 15, it can be seen that, if the cutoff time of the $NH_3$ gas in one cycle (11 seconds) of supply and cutoff of the $NH_3$ gas is made longer, the in-plane thickness uniformity of the substrates W deteriorates slightly but not severely.

Figure 16:
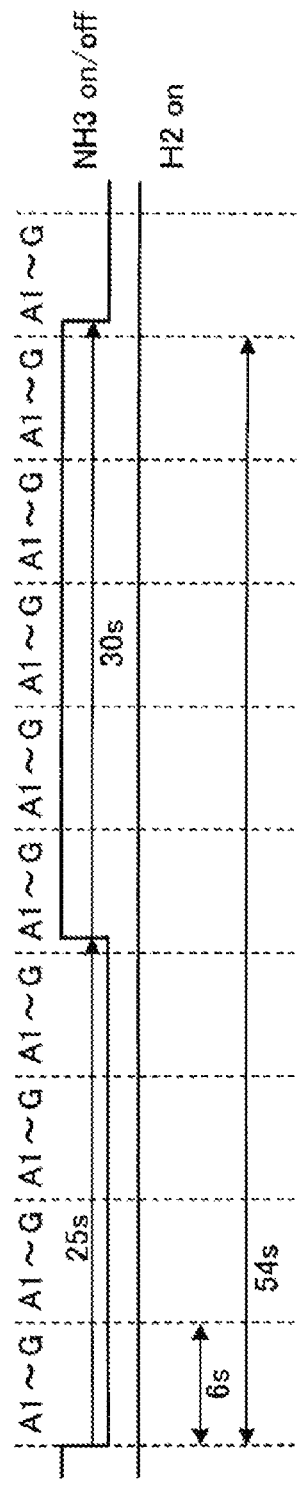
FIG. 16 is a view showing one example of a supply timing of a NH$_3$ gas in a case where the supply and cutoff of the NH$_3$ gas is controlled at 55 seconds per one cycle.

FIG. 16 is a view showing one example of a supply timing of a $NH_3$ gas in a case where the supply and cutoff of the $NH_3$ gas is controlled at 55 seconds per one cycle. Symbols "A1", "A2", "A3", "A4", "Ad" and "G" shown in FIG. 16 designate the region A1, the region A2, the region A3, the region A4, the region Ad and the region G, respectively, which are defined within the process vessel 12.

In FIG. 16, there is illustrated a case where the division number y of the process vessel 12 is 6, the time x required for the mounting stand 14 to make one revolution is 6 seconds, and the value of k is 9. In this case, xk+1=55. Therefore, it is possible to select, e.g., 30 as the m and to select, e.g., 25 as the n within a range in which the time m+n required in performing one cycle of supply and stop of the $NH_3$ gas becomes equal to 55. In FIG. 16, there is illustrated a supply timing of a $NH_3$ gas in a case where 30 seconds is selected as the supply time m of the $NH_3$ gas and 25 seconds is selected as the cutoff time n of the $NH_3$ gas.

In the example shown in FIG. 16, each time when the mounting stand 14 makes nine revolutions, the time required for the mounting stand 14 to make nine revolutions and the time required in performing one cycle of supply and cutoff of the $NH_3$ gas deviate from each other by the time required for the substrates W to pass through one compartment within the process vessel 12. In the example shown in FIG. 16, the division number y of the interior of the process vessel 12 is 6 and the number of seconds x of the time required for the mounting stand 14 to make one revolution is 6. Therefore, if the mounting stand 14 makes fifty four revolutions, the cumulative value of the deviation between the time required for the mounting stand 14 to make two revolutions and the time required in performing one cycle of supply and cutoff of the $NH_3$ gas becomes equal to the time required for the substrates W to pass through six compartments defined within the process vessel 12, namely 6 seconds which is the time corresponding to one lap.

Figure 17:
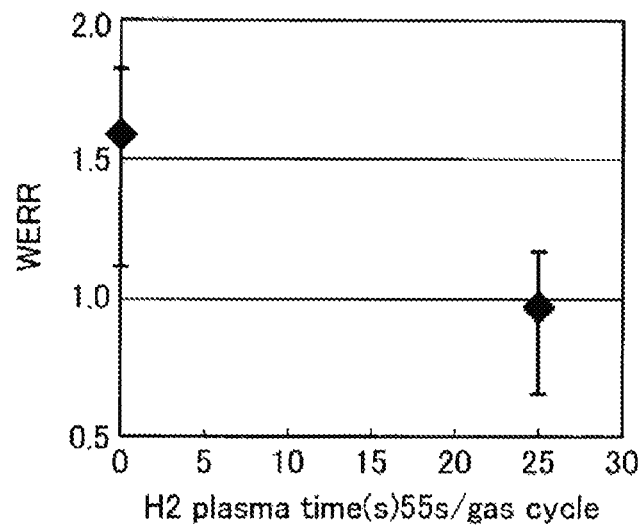
FIG. 17 is a view showing one example of a relationship between a cutoff time of a NH$_3$ gas and film quality.

FIG. 17 is a view showing one example of a relationship between a cutoff time of a $NH_3$ gas and film quality. The horizontal axis in FIG. 17 indicates the cutoff time of the $NH_3$ gas in one cycle (55 seconds) of supply and cutoff of the $NH_3$ gas. The vertical axis in FIG. 17 indicates the WERR. Referring to FIG. 17, it can be noted that, if the cutoff time of the $NH_3$ gas in one cycle (55 seconds) of supply and cutoff of the $NH_3$ gas is made longer, the value of the WERR grows smaller and the film quality grows higher.

Figure 18:
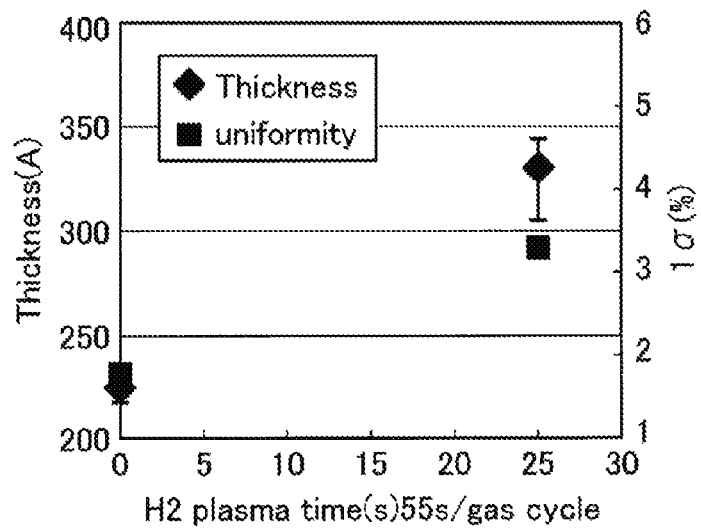
FIG. 18 is a view showing one example of a relationship between a cutoff time of a NH$_3$ gas, a film thickness and thickness uniformity.

FIG. 18 is a view showing one example of a relationship between a cutoff time of a $NH_3$ gas, a film thickness and thickness uniformity. The horizontal axis in FIG. 18 indicates the cutoff time of the $NH_3$ gas in one cycle (55 seconds) of supply and cutoff of the $NH_3$ gas. The vertical axis in FIG. 18 indicates the film thickness or the thickness uniformity (1σ). Referring to FIG. 18, it can be seen that, if the cutoff time of the $NH_3$ gas in one cycle (55 seconds) of supply and cutoff of the $NH_3$ gas is made longer, the in-plane thickness uniformity of the substrates W deteriorates slightly but not severely.

Figure 19:
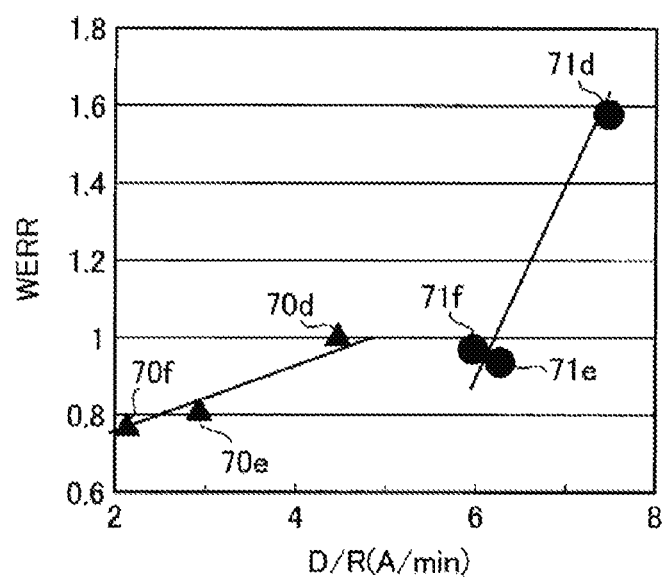
FIG. 19 is a view showing one example of a relationship between a deposition rate and film quality.

FIG. 19 is a view showing one example of a relationship between a deposition rate and a film quality. In FIG. 19, reference symbols 70d, 70e and 70f indicate the measured values at different rotation speeds of the mounting stand 14 in a process in which the $NH_3$ gas is not cut off, namely a process which does not perform a modifying operation. Reference symbol 70d indicates the measured value in a case where the rotation speed of the mounting stand 14 is 5 rpm. Reference symbol 70e indicates the measured value in a case where the rotation speed of the mounting stand 14 is 3 rpm. Reference symbol 70f indicates the measured value in a case where the rotation speed of the mounting stand 14 is 2 rpm.

Reference symbol 71d indicates the measured value in a process in which the $NH_3$ gas is not cut off, namely a process which does not perform a modifying operation. Reference symbol 71e indicates the measured value in a case where the cutoff of the $NH_3$ gas per one cycle (11 seconds) of supply and cutoff of the $NH_3$ gas is performed for 5 seconds. Reference symbol 71f indicates the measured value in a case where the cutoff of the $NH_3$ gas per one cycle (55 seconds) of supply and cutoff of the $NH_3$ gas is performed for 25 seconds. In the measured values indicated by reference symbols 71d, 71e and 71f, the rotation speed of the mounting stand 14 is 10 rpm.

As is apparent from the measured values of reference symbols 70d, 70e and 70f, even when the cutoff time of the $NH_3$ gas is not set, namely even when the cutoff time of the reaction gas is not set, if the rotation speed of the mounting stand 14 is lowered, the WERR becomes small and the film quality improves. Furthermore, as is clear from the measured values of reference symbols 71d, 71e and 71f, if the cutoff time of the $NH_3$ gas is set, namely if the cutoff time of the reaction gas is set, the WERR becomes small and the film quality improves. It can also be noted that, if the ratio of the length of the cutoff time of the $NH_3$ gas to the length of one cycle of supply and cutoff of the $NH_3$ gas remains constant, the film quality and the value of the deposition rate is substantially unchanged.

Furthermore, the measured value of reference symbol 70d and the measured value of reference symbol 71e or 71f are approximately equal in the value of WERR to each other. However, the measured value of reference symbol 71e or 71f is higher in the deposition rate than the measured value of reference symbol 70d. Accordingly, in the case of the measured value of reference symbol 71e, namely in a case of the process in which the supply time of the $NH_3$ gas per one cycle (11 seconds) of supply and cutoff of the $NH_3$ gas is set at 6 seconds and the cutoff time of the $NH_3$ gas is set at 5 seconds, or in the case of the measured value of reference symbol 71f, namely in a case of the process in which the supply time of the $NH_3$ gas per one cycle (55 seconds) of supply and cutoff of the $NH_3$ gas is set at 30 seconds and the cutoff time of the $NH_3$ gas is set at 25 seconds, it is possible to make the throughput higher than the throughput obtained in the case of the measured value of reference symbol 70d, namely in a case of the process in which the rotation speed of the mounting stand 14 is set at 5 rpm.

Third Embodiment

Figure 20:
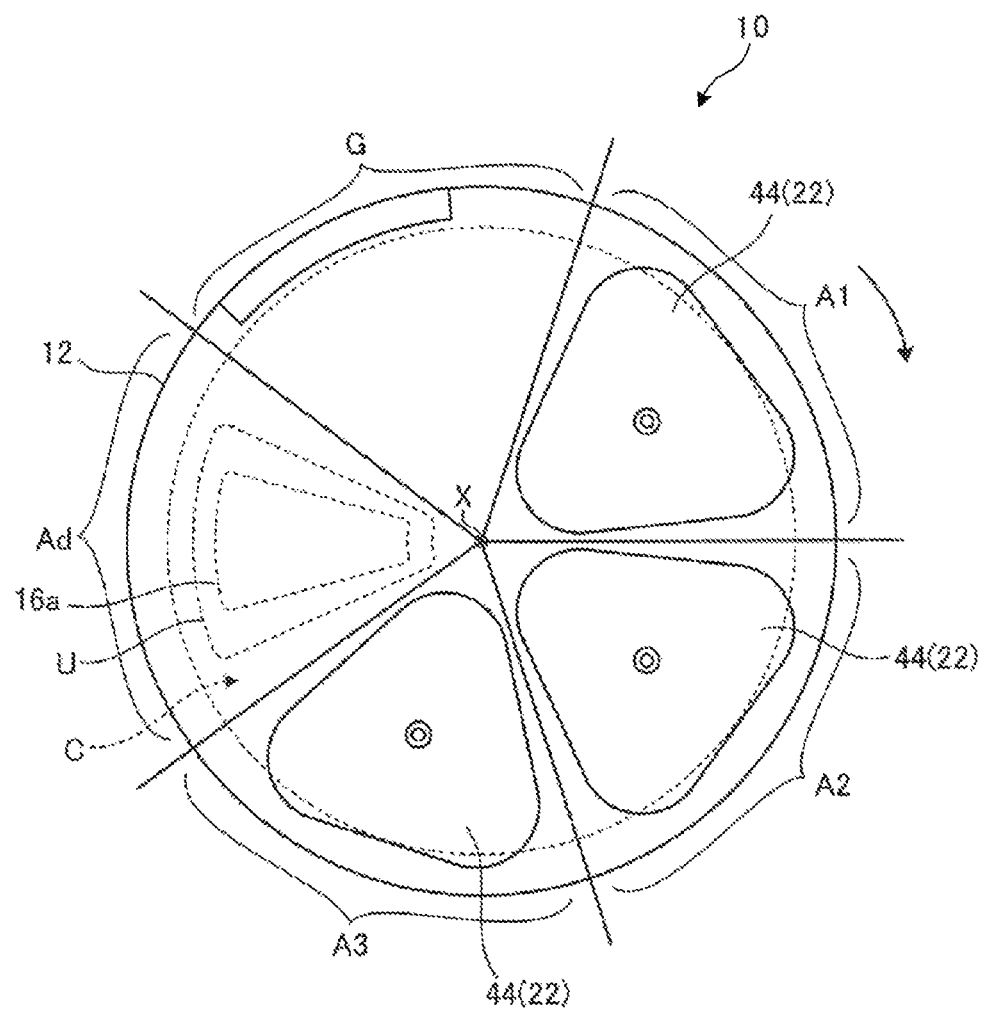
FIG. 20 is a top view schematically showing a substrate processing apparatus according to a third embodiment.

FIG. 20 is a top view schematically showing a substrate processing apparatus 10 according to a third embodiment. Except for the points to be described below, the components of FIG. 20 designated by the same reference symbols as those of FIG. 6 have the functions identical with or similar to those of the components shown in FIG. 6. Thus, description will be omitted on these components.

In the present embodiment, for example, as shown in FIG. 20, the plasma generating units 22 are respectively installed in three consecutive regions among five substantially-identical fan-shaped regions defined by dividing a substantially-circular plane existing above the process vessel 12 about the axis X. Each of the plasma generating units 22 includes an antenna 44 configured to output microwaves. A connection portion 44a, to which a coaxial waveguide for supplying microwaves to the antenna 44 is connected, is installed at the gravity center of the antenna 44.

Figure 21:
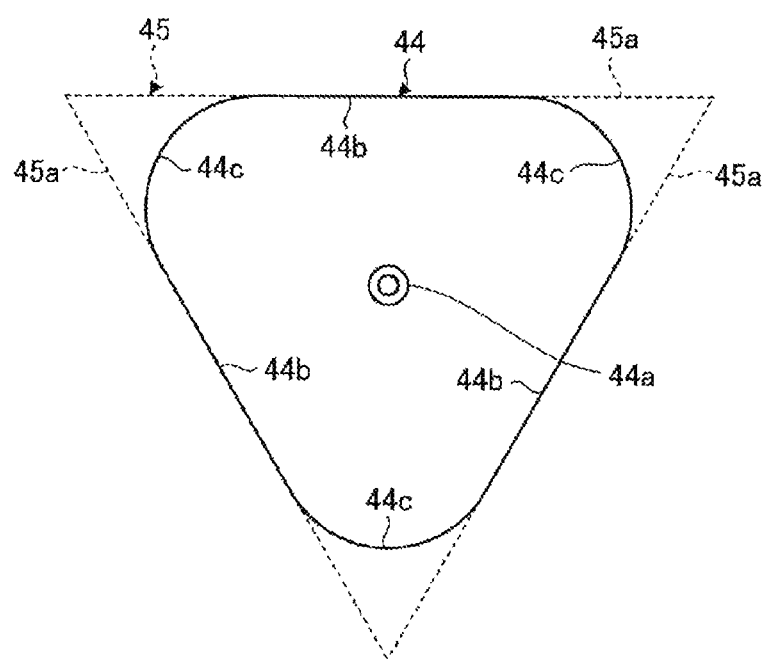
FIG. 21 is a view showing one example of a schematic shape of an antenna.

FIG. 21 is a view showing one example of a schematic shape of the antenna 44. The cross-sectional outline of the antenna 44 seen in the direction of the axis X is a shape with line segments including two line segments which go away from each other as the distance from the axis X increases. Furthermore, the cross-sectional outline of the antenna 44 seen in the direction of the axis X is a substantially equilateral triangular shape with round corners. The contour of the antenna 44 includes three lines 44b and three lines 44c. Each of the lines 44b is included in each of the sides 45a which constitute a substantially equilateral triangle 45. Each of the lines 44c interconnects the ends of the adjoining lines 44b with a curved line bulging outward of the antenna 44. Each of the lines 44c is, e.g., a portion of a circle having a specified radius. This makes it possible to suppress concentration of stresses on a specific position within the antenna 44.

The cross-sectional outline of the antenna 44 seen in the direction of the axis X may be a shape having rotational symmetry (e.g., 3-fold symmetry). The connection portion 44a may be installed at the center (e.g., the gravity center) of the antenna 44. Thus, the microwaves propagated through the coaxial waveguide are uniformly transmitted from the upper end of the connection portion 44a into the antenna 44. Consequently, the microwaves transmitted into the antenna 44 are uniformly propagated through the process vessel 12. This makes it possible to generate plasma with increased uniformity.

According to some embodiments of the substrate processing apparatus and the substrate processing method of the present disclosure, it is possible to apply a plasma modifying effect to a substrate in a cost-effective manner.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method implemented in a substrate processing apparatus which includes a mounting stand provided with a substrate mounting region in which a workpiece substrate is mounted, the mounting stand being installed so as to rotate about an axis such that the substrate mounting region is moved in a circumferential direction, and a process vessel configured to define a process chamber which accommodates the mounting stand therein, the process chamber including a first region and a second region through which the substrate mounting region moving about the axis in the circumferential direction upon rotation of the mounting stand passes in order, the method comprising:

forming an adsorption layer on a surface of the workpiece substrate in the first region by supplying a precursor gas to the first region, while rotating the mounting stand about the axis; and repeating a cycle in the second region while rotating the mounting stand about the axis, the cycle including:

reacting, for a first time period, the surface of the workpiece substrate on which an adsorption layer is formed with a reaction gas by supplying the reaction gas to the entirety of the second region and generating plasma of the reaction gas; and modifying, for a second time period, the reacted surface of the workpiece substrate by supplying a modifying gas, which is different from the reaction gas, to the entirety of the second region and generating plasma of the modifying gas, wherein the total sum of the first time period and the second time period differs in length from a time required for the mounting stand to make any natural number of rotation.

2. The method of claim 1, wherein the substrate processing apparatus includes a plurality of plasma generating units disposed in the second region, the plasma generating units configured to generate plasma by using the reaction gas or the modifying gas in common.

3. The method of claim 1, wherein a length of the first time period, a length of the second time period, a rotation speed of the mounting stand, and a length of a process time are set such that a position of the workpiece substrate at a starting time of a first repetition of the cycle and a location of the workpiece substrate at an ending time of a last repetition of the cycle are the same position within the process vessel in a rotational direction of the mounting stand.

4. The method of claim 3, wherein the process time is set to become equal to a time length which is a common multiple of a length of the time required for the mounting stand to make a single rotation about the axis and a length of the total sum of the first time period and the second time period.

5. The method of claim 1, wherein the cycle is repeated based on the first time period and the second time period which satisfy the following relational expression:

$$xk+1=m+n \text{ or } xk-1=m+n$$

where m is the first time period (seconds, a natural number), n is the second time period (seconds, a natural number), x is a time required for the mounting stand to make a single rotation (seconds, a natural number), and k is an arbitrary natural number.

6. The method of claim 1, wherein the precursor gas contains at least silane, the reaction gas contains at least nitrogen, and the modifying gas contains at least hydrogen.

7. The method of claim 1, wherein the reaction gas is a mixture of a plurality of gases and the modifying gas is a single gas contained in the reaction gas.

8. The method of claim 1, wherein the reaction gas is a mixture of a plurality of gases and the modifying gas is a single gas different from any one of the plurality of gases contained in the reaction gas.

* * * * *